(12) United States Patent
Choi et al.

(10) Patent No.: US 8,329,523 B2
(45) Date of Patent: Dec. 11, 2012

(54) ARRAY SUBSTRATE FOR DISLAY DEVICE AND METHOD OF FABRICATING THE SAME

(75) Inventors: Hee-Dong Choi, Seosan-si (KR); Ki-Sul Cho, Gumi-si (KR); Hye-Young Choi, Seoul (KR); Doo-Seok Yang, Incheon (KR); Byeong-Gyu Roh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 446 days.

(21) Appl. No.: 12/654,584

(22) Filed: Dec. 23, 2009

(65) Prior Publication Data

US 2010/0289023 A1 Nov. 18, 2010

(30) Foreign Application Priority Data

May 15, 2009 (KR) ......................... 10-2009-0042813
Nov. 11, 2009 (KR) ......................... 10-2009-0108552

(51) Int. Cl.
*H01L 21/00* (2006.01)
*H01L 21/84* (2006.01)

(52) U.S. Cl. ........ 438/158; 349/139; 349/140; 349/141; 349/142; 257/59; 257/72; 257/211; 257/88

(58) Field of Classification Search ......................... None
See application file for complete search history.

(56) References Cited

U.S. PATENT DOCUMENTS 7,833,846 B1 * 11/2010 Choi et al. ..................... 438/149
7,989,850 B2 * 8/2011 Choi ............................. 257/211
8,198,631 B2 * 6/2012 Choi et al. ..................... 257/59

* cited by examiner

*Primary Examiner* — Julio J Maldonado
*Assistant Examiner* — Shantanu C Pathak
(74) *Attorney, Agent, or Firm* — McKenna Long & Aldridge LLP

(57) ABSTRACT

A method of fabricating an array substrate for a display device includes: forming a buffer layer on a substrate having a pixel region; sequentially forming a gate electrode of impurity-doped polycrystalline silicon, a gate insulating layer and an active layer of intrinsic polycrystalline silicon on the buffer layer in the pixel region; forming an interlayer insulating layer of an inorganic insulating material on the active layer; sequentially forming a source barrier pattern, a source ohmic contact layer and a source electrode on the interlayer insulating layer, sequentially forming a drain barrier pattern, a drain ohmic contact layer and a drain electrode on the interlayer insulating layer, and sequentially forming a first dummy pattern, a second dummy pattern and a data line on the interlayer insulating layer; forming a first passivation layer on a surface of the interlayer insulating layer including the source electrode, the drain electrode and the data line formed thereon; forming a gate line on the first passivation layer; forming a second passivation layer on a surface of the first passivation layer including the gate line formed thereon; and forming a pixel electrode on the second passivation layer.

21 Claims, 19 Drawing Sheets

Solid phase crystallization(SPC)

Solid phase crystallization(SPC)

Solid phase crystallization(SPC)

ARRAY SUBSTRATE FOR DISLAY DEVICE AND METHOD OF FABRICATING THE SAME

This application claims the benefit of Korean Patent Application No. 2009-0042813 filed on May 15, 2009 and Korean Patent Application No. 2009-0108552 filed on Nov. 11, 2009, which are hereby incorporated by reference for all purposes as if fully set forth herein.

BACKGROUND OF THE INVENTION

1. Field of the Invention

The present application relates to an array substrate for a display device, and more particularly, to an array substrate that includes a thin film transistor having a high mobility due to prevention of a surface damage by a dry etching process and a method of fabricating the array substrate.

2. Discussion of the Related Art

As information age progresses, display devices processing and displaying an amount of information have been developed. Among the various types of display devices, liquid crystal display (LCD) devices or electroluminescent display (ELD) devices having light weight, thin profile, and low power consumption have been substituted for cathode ray tube (CRT) devices.

Among LCD devices, active matrix LCD (AM-LCD) devices that employ switching elements and pixel electrodes arranged in a matrix structure are the subject of significant research and development because of their high resolution and superior suitability for displaying moving images.

In addition, since organic electroluminescent display (OELD) devices, which is referred to as organic light emitting diode (OLED) devices, have an emissive type with high brightness and low driving voltage, the OLED devices have advantages such as high contrast ratio, ultra thin profile, short response time of about several microseconds, wide viewing angle and stability at low temperature. For example, the OLED devices may be driven with a driving voltage of about 5V DC to about 15V DC. Accordingly, design and fabrication of a driving circuit for the OLED devices are simplified.

Each of the LCD device and the OLED device includes an array substrate having a thin film transistor as a switching element for a pixel region.

FIG. 1 is a cross-sectional view showing an array substrate for a display device according to the related art.

In FIG. 1, a gate line (not shown) and a gate electrode 15 are formed in a pixel region P on a substrate 11, and a gate insulating layer 18 is formed on the gate line and the gate electrode 15. A semiconductor layer 28 including an active layer 22 of intrinsic amorphous silicon and an ohmic contact layer 26 of impurity-doped amorphous silicon is formed on the gate insulating layer 18 over the gate electrode 15. Source and drain electrodes 36 and 38 spaced apart from each other are formed on the ohmic contact layer 26. The gate electrode 15, the gate insulating layer 18, the semiconductor layer 28, the source electrode 36 and the drain electrode 38 constitute a thin film transistor (TFT) Tr.

In addition, a passivation layer 42 is formed on the TFT Tr. The passivation layer 42 has a drain contact hole 45 exposing the drain electrode 38. A pixel electrode 50 is formed on the passivation layer 42 in the pixel region P. The pixel electrode 50 is connected to the drain electrode 38 through the drain contact hole 45.

A data line 33 including first and second patterns 27 and 23 is formed on the substrate 11. The data line 33 crosses the gate line to define the pixel region P. The first and second patterns 27 and 23 have the same layers as the ohmic contact layer 26 and the active layer 22, respectively.

The active layer 22 of the semiconductor layer 28 has a first portion exposed through the ohmic contact layer 26 and a second portion under the ohmic contact layer 26. The first and second portions of the active layer 22 have first and second thicknesses t1 and t2, respectively, different from each other. (t1≠t2) The thickness difference of the active layer 22 that results from a fabrication method causes degradation in characteristic of the TFT Tr.

FIGS. 2A to 2E are cross-sectional views showing a process of forming a semiconductor layer, a source electrode and a drain electrode of an array substrate for a display device according to the related art. For simplicity in illustration, a gate electrode and a gate insulating layer between the array substrate and the semiconductor layer are omitted in FIGS. 2A to 2E.

In FIG. 2A, an intrinsic amorphous silicon layer 20, an impurity-doped silicon layer 24 and a metal layer 30 are sequentially formed on the substrate 11. After a photo resist (PR) layer (not shown) is formed on the metal layer 30, a light is irradiated onto the PR layer using a photo mask to form a first PR pattern 91 corresponding to the source and drain electrodes and a second PR pattern 92 corresponding to the first portion exposed through the source and drain electrodes 36 and 38 (of FIG. 1). The first and second PR patterns 91 and 92 have third and fourth thicknesses t3 and t4, respectively. The fourth thickness t4 is smaller than the third thickness t3. (t4<t3)

In FIG. 2B, the metal layer 30 (of FIG. 2A), the impurity-doped silicon layer 24 (of FIG. 2A) and the intrinsic amorphous silicon layer 20 (of FIG. 2A) are etched using the first and second PR patterns 91 and 92 as an etching mask so that a source-drain pattern 31, an impurity-doped amorphous silicon pattern 25 and the active layer 22 can be formed.

In FIG. 2C, through an ashing process, the second PR pattern 92 (of FIG. 2A) having the fourth thickness t4 (of FIG. 2A) is removed and the first PR pattern 91 (of FIG. 2A) having the third thickness t3 (of FIG. 2A) is partially removed so that a third PR pattern 93 having a reduced thickness can be formed on the source-drain pattern 31.

In FIG. 2D, the source-drain pattern 31 (of FIG. 2C) is etched using the third PR pattern 93 as an etching mask so that the source and drain electrodes 36 and 38 can be formed and the impurity-doped amorphous silicon pattern 25 can be exposed between the source and drain electrodes 36 and 38.

In FIG. 2E, the impurity-doped amorphous silicon pattern 25 (of FIG. 2D) exposed between the source and drain electrodes 36 and 38 is etched through a dry etching step so that the ohmic contact layer 26 can be formed under the source and drain electrodes 36 and 38. When the dry etching step is performed for an insufficient time, the impurity-doped amorphous silicon pattern 25 may remain on the active layer 22 between the source and drain electrodes 36 and 38. The remaining impurity-doped amorphous silicon pattern may connect the source and drain electrodes 36 and 38 to deteriorate the TFT Tr (of FIG. 1). For the purpose of removing the impurity-doped amorphous silicon pattern 25 exposed between the source and drain electrodes 36 and 38 completely, the dry etching step is performed for a sufficiently long time. Accordingly, the active layer 22 under the impurity-doped amorphous silicon pattern 25 exposed between the source and drain electrodes 36 and 38 is partially etched.

As a result, the first portion of the active layer 22 exposed through the ohmic contact layer 26 has the first thickness t1 and the second portion of the active layer 22 under the ohmic contact layer 26 has the second thickness t2 different from the first thickness t1. (t1≠t2) The thickness difference of the active layer 22 causes degradation in characteristic of the TFT Tr (of FIG. 1). In addition, since the active layer 22 is partially removed during the drying etching step for the ohmic contact layer 26, the intrinsic amorphous silicon layer 20 (of FIG. 2A) is formed to have a sufficient thickness, for example, within a range of about 1500 Å to about 1800 Å. Accordingly, the deposition time for the intrinsic amorphous silicon layer 20 (of FIG. 2A) increases and the productivity is reduced.

The TFT connected to the gate line and the data line transmits the data signal to the pixel electrode periodically. Since amorphous silicon is disordered, the amorphous silicon has a quasi-stable state when a light is irradiated or when an electric field is applied. Accordingly, the TFT including the active layer of amorphous silicon has a disadvantage in stability. Further, since the carrier mobility is within a range of about 0.1 cm$^2$/V·s to about 1.0 cm$^2$/V·s in the channel region, the TFT including the active layer of amorphous silicon can not be used as a switching element for a driving circuit.

To solve the above problems, the TFT including the active layer of poly crystalline silicon has been suggested. The polycrystalline silicon may be formed through a crystallization process for amorphous silicon using a laser apparatus.

FIG. 3 is a cross-sectional view showing an array substrate having a thin film transistor according to the related art.

In FIG. 3, a thin film transistor (TFT) Tr including a semiconductor layer 55 of polycrystalline silicon is formed on a substrate 51. The semiconductor layer 55 includes an active region 55a and source and drain regions 55b at both sides of the active region 55a. Although the active region 55a includes intrinsic polycrystalline silicon, the source and drain regions 55b include impurity-doped polycrystalline silicon. The source and drain regions 55b include negative impurities of high concentration (n+) or positive impurities of high concentration (p+). Accordingly, a doping step is required for the source and drain regions 55b and an implantation apparatus is additionally required for the doping step. As a result, fabrication cost increases. Furthermore, a new fabrication line of the array substrate is required for the implantation apparatus.

SUMMARY OF THE INVENTION

Accordingly, the present invention is directed to an array substrate for a display device that substantially obviates one or more of the problems due to limitations and disadvantages of the related art.

An advantage of the present invention is to provide an array substrate and a method of fabricating the array substrate where characteristics of a thin film transistor is improved because an active layer is not exposed in a dry etching step and a surface damage of the active layer is prevented.

Another advantage of the present invention is to provide an array substrate and a method of fabricating the array substrate where a mobility of a thin film transistor is improved by using a semiconductor layer of polycrystalline silicon without a doping step.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an array substrate for a display device includes: forming a buffer layer on a substrate having a pixel region; sequentially forming a gate electrode of impurity-doped polycrystalline silicon, a gate insulating layer and an active layer of intrinsic polycrystalline silicon on the buffer layer in the pixel region, edge portions of the gate electrode exposed through the active layer; forming an interlayer insulating layer of an inorganic insulating material on the active layer, the interlayer insulating layer including active contact holes exposing the active layer; sequentially forming a source barrier pattern, a source ohmic contact layer and a source electrode on the interlayer insulating layer, sequentially forming a drain barrier pattern, a drain ohmic contact layer and a drain electrode on the interlayer insulating layer, and sequentially forming a first dummy pattern, a second dummy pattern and a data line on the interlayer insulating layer, wherein the source barrier pattern, the drain barrier pattern and the first dummy pattern include intrinsic amorphous silicon, wherein the source ohmic contact layer, the drain ohmic contact layer and the second dummy pattern include impurity-doped amorphous silicon, wherein the source and drain barrier patterns are connected to the active layer through the active contact holes, and wherein the data line is connected to the source electrode; forming a first passivation layer on a surface of the interlayer insulating layer including the source electrode, the drain electrode and the data line formed thereon, the first passivation layer and the interlayer insulating layer including a gate contact hole exposing the gate electrode; forming a gate line on the first passivation layer, the gate line connected to the gate electrode through the gate contact hole and crossing the data line to define the pixel region; forming a second passivation layer on a surface of the first passivation layer including the gate line formed thereon, the second passivation layer and the first passivation layer including a drain contact hole exposing the drain electrode; and forming a pixel electrode on the second passivation layer, the pixel electrode connected to the drain electrode through the drain contact hole.

In another aspect, an array substrate for a display device, the array substrate includes: a buffer layer on a substrate having a pixel region; a gate electrode of impurity-doped polycrystalline silicon on the buffer layer; a gate insulating layer on the gate electrode; an active layer on the gate insulating layer, edge portions of the gate electrode exposed through the active layer; an interlayer insulating layer on the active layer, the interlayer insulating layer including active contact holes exposing the active layer; source and drain barrier patterns of intrinsic amorphous silicon on the interlayer insulating layer, the source and drain barrier patterns connected to the active layer through the active contact holes; source and drain ohmic contact layers of impurity-doped amorphous silicon on the source and drain barrier patterns, respectively; source and drain electrodes on the source and drain ohmic contact layers, respectively; a data line connected to the source electrode; a first passivation layer on a surface of the interlayer insulating layer including the data line formed thereon, the first passivation layer and the interlayer insulating layer including a gate contact hole exposing the gate electrode; a gate line on the first passivation layer and crossing the data line to define the pixel region, the gate line connected to the gate electrode through the gate contact hole; a second passivation layer on a surface of the first passivation layer including the gate line formed thereon, the second passivation layer and the first passivation layer including a drain contact hole exposing the drain electrode; and a pixel electrode on the second passivation layer, the pixel electrode connected to the drain electrode through the drain contact hole.

In another aspect, a method of fabricating an array substrate for a display device includes: forming a buffer layer on a substrate having a pixel region; sequentially forming a gate electrode of at least one of molybdenum (Mo), molybdenum (Mo) alloy and copper (Cu), a gate insulating layer and an active layer of intrinsic polycrystalline silicon on the buffer layer in the pixel region, edge portions of the gate electrode exposed through the active layer; forming an interlayer insulating layer of an inorganic insulating material on the active layer, the interlayer insulating layer including active contact holes exposing the active layer; sequentially forming a source barrier pattern, a source ohmic contact layer and a source electrode on the interlayer insulating layer, sequentially forming a drain barrier pattern, a drain ohmic contact layer and a drain electrode on the interlayer insulating layer, and sequentially forming a first dummy pattern, a second dummy pattern and a data line on the interlayer insulating layer, wherein the source barrier pattern, the drain barrier pattern and the first dummy pattern include intrinsic amorphous silicon, wherein the source ohmic contact layer, the drain ohmic contact layer and the second dummy pattern include impurity-doped amorphous silicon, wherein the source and drain barrier patterns are connected to the active layer through the active contact holes, and wherein the data line is connected to the source electrode; forming a first passivation layer on a surface of the interlayer insulating layer including the source electrode, the drain electrode and the data line formed thereon, the first passivation layer and the interlayer insulating layer including a gate contact hole exposing the gate electrode; forming a gate line on the first passivation layer, the gate line connected to the gate electrode through the gate contact hole and crossing the data line to define the pixel region; forming a second passivation layer on a surface of the first passivation layer including the gate line formed thereon, the second passivation layer and the first passivation layer including a drain contact hole exposing the drain electrode; and forming a pixel electrode on the second passivation layer, the pixel electrode connected to the drain electrode through the drain contact hole.

In another aspect, an array substrate for a display device includes: a buffer layer on a substrate having a pixel region; a gate electrode of at least one of molybdenum (Mo), molybdenum (Mo) alloy and copper (Cu) on the buffer layer; a gate insulating layer on the gate electrode; an active layer on the gate insulating layer, edge portions of the gate electrode exposed through the active layer; an interlayer insulating layer on the active layer, the interlayer insulating layer including active contact holes exposing the active layer; source and drain barrier patterns of intrinsic amorphous silicon on the interlayer insulating layer, the source and drain barrier patterns connected to the active layer through the active contact holes; source and drain ohmic contact layers of impurity-doped amorphous silicon on the source and drain barrier patterns, respectively; source and drain electrodes on the source and drain ohmic contact layers, respectively; a data line connected to the source electrode; a first passivation layer on a surface of the interlayer insulating layer including the data line formed thereon, the first passivation layer and the interlayer insulating layer including a gate contact hole exposing the gate electrode; a gate line on the first passivation layer and crossing the data line to define the pixel region, the gate line connected to the gate electrode through the gate contact hole; a second passivation layer on a surface of the first passivation layer including the gate line formed thereon, the second passivation layer and the first passivation layer including a drain contact hole exposing the drain electrode; and a pixel electrode on the second passivation layer, the pixel electrode connected to the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the embodiments of the present invention, examples of which are illustrated in the accompanying drawings. Wherever possible, similar reference numbers will be used to refer to the same or similar parts.

FIGS. 4A to 4M are cross-sectional views showing a method of fabricating an array substrate having a pixel region according to a first embodiment of the present invention, FIGS. 5A to 5M are cross-sectional views showing a method of fabricating an array substrate having a gate pad area according to a first embodiment of the present invention, and FIGS. 6A to 6M are cross-sectional views showing a method of fabricating an array substrate having a data pad area according to a first embodiment of the present invention.

Figure 4A:
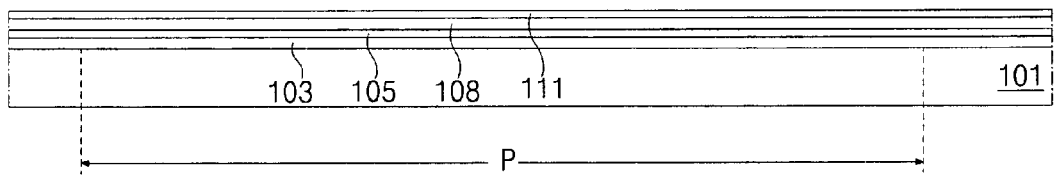
FIGS. 4A to 4M are cross-sectional views showing a method of fabricating an array substrate having a pixel region according to a first embodiment of the present invention.
Figure 5A:
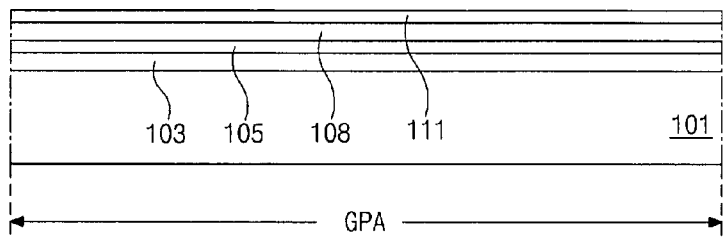
FIGS. 5A to 5M are cross-sectional views showing a method of fabricating an array substrate having a gate pad area according to a first embodiment of the present invention.
Figure 6A:
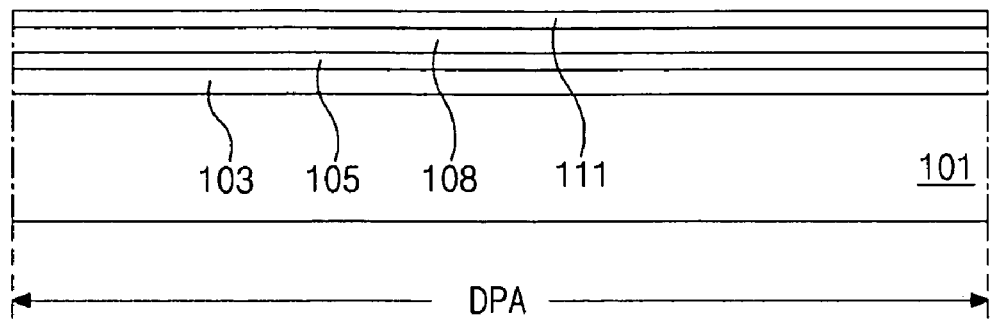
FIGS. 6A to 6M are cross-sectional views showing a method of fabricating an array substrate having a data pad area according to a first embodiment of the present invention.

In FIGS. 4A, 5A and 6A, a buffer layer 103 is formed on a substrate 101 having a pixel region P, a gate pad area GPA and a data pad area DPA by depositing an inorganic insulating material such as silicon oxide ($SiO_2$) and silicon nitride (SiNx). For example, the buffer layer 103 may have a thickness of about 2000 Å to about 3000 Å. In a subsequent step using a solid phase crystallization (SPC) method, an amorphous silicon layer is crystallized to become a polycrystalline silicon layer under a temperature of about 600° C. to about 700° C. Alkali ions erupted from the substrate 101 during the SPC step may deteriorate the polycrystalline silicon layer. The buffer layer 103 prevents the eruption of the alkali ions from the substrate 101.

Figure 1:
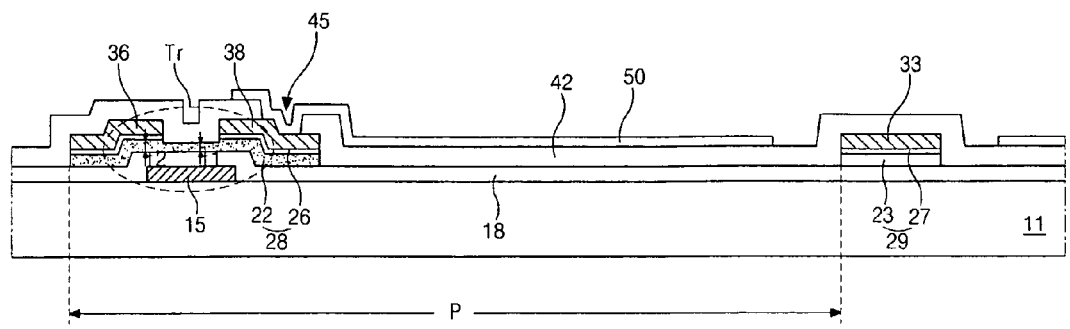
FIG. 1 is a cross-sectional view showing an array substrate for a display device according to the related art.
Figure 2A:
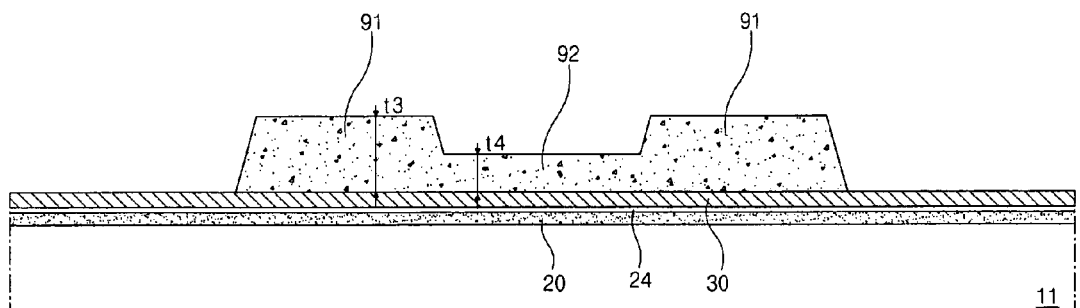
FIGS. 2A to 2E are cross-sectional views showing a process of forming a semiconductor layer, a source electrode and a drain electrode of an array substrate for a display device according to the related art.
Figure 2B:
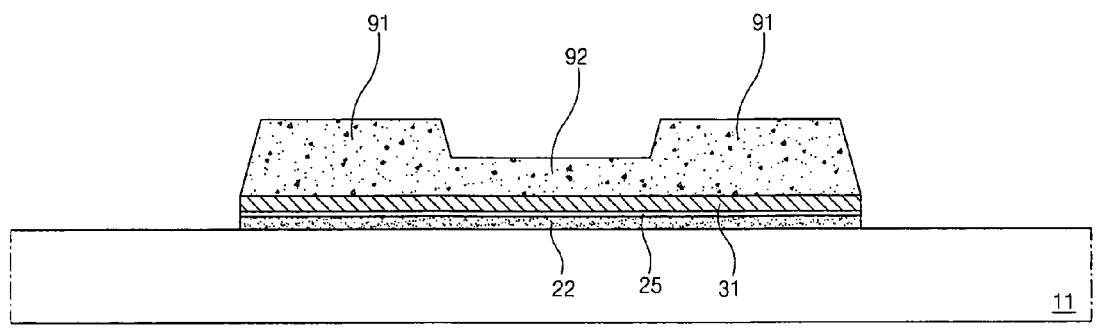
Figure 2C:
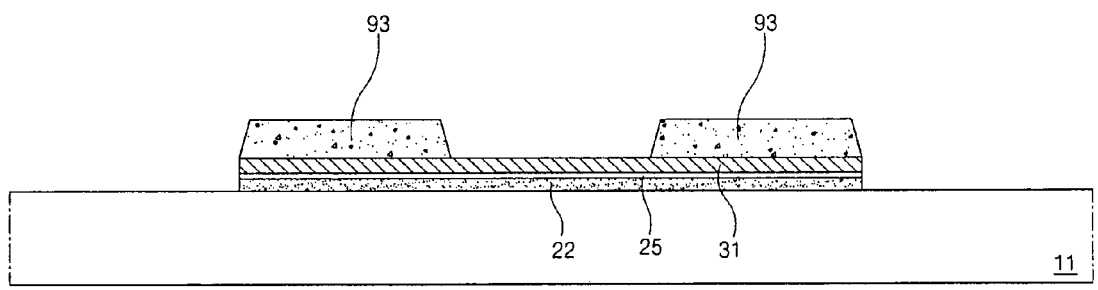
Figure 2D:
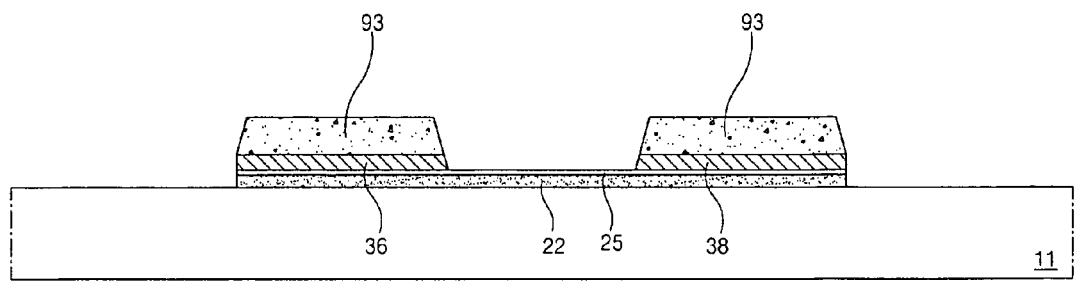
Figure 2E:
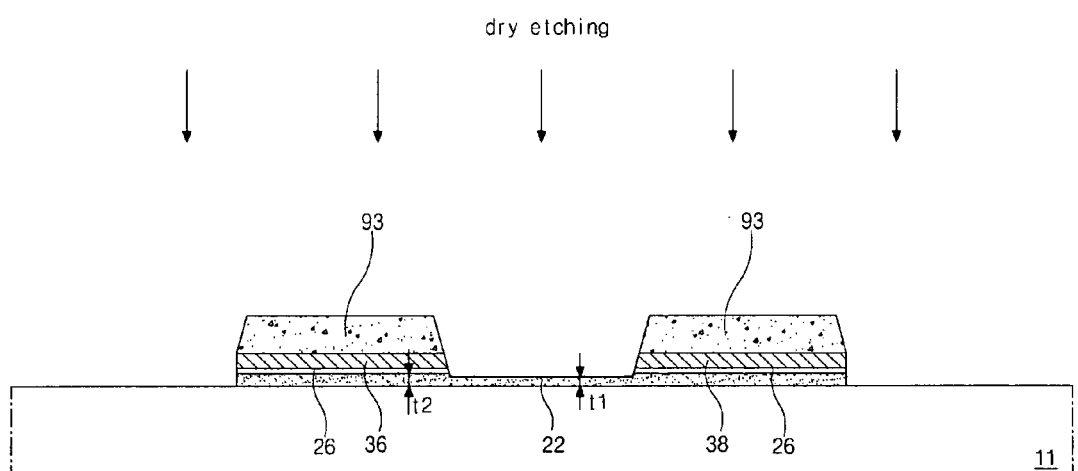
Figure 3:
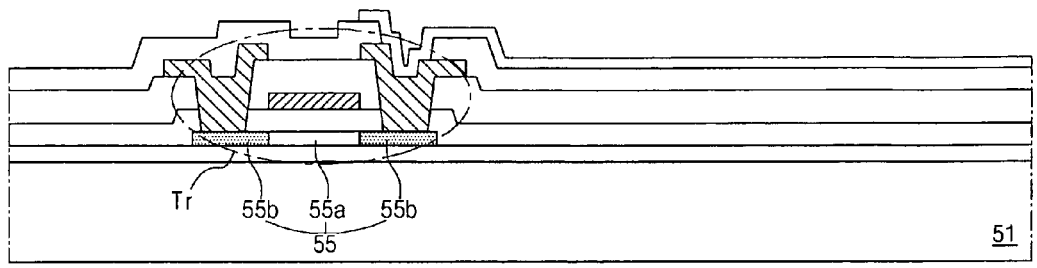
FIG. 3 is a cross-sectional view showing an array substrate having a thin film transistor according to the related art.

In addition, a first impurity-doped amorphous silicon layer 105, a first inorganic insulating layer 108 and an intrinsic amorphous silicon layer 111 are sequentially formed on the buffer layer 103. For example, the first impurity-doped amorphous silicon layer 105 of impurity-doped amorphous silicon may have a thickness of about 500 Å to about 1000 Å, and the first inorganic insulating layer 108 of an inorganic insulating material such as silicon oxide (SiO2) may have a thickness of about 500 Å to about 4000 Å. The intrinsic amorphous silicon layer 111 of intrinsic amorphous silicon may have a thickness of about 400 Å to about 600 Å, which is smaller than a thickness of the intrinsic amorphous silicon layer 20 (of FIG. 2A). Since the active layer 115 (of FIG. 4M) of polycrystalline silicon obtained from the intrinsic amorphous silicon layer 111 is not exposed in a dry etching step, a thickness of the active layer is not reduced. As a result, the intrinsic amorphous silicon layer 111 has a reduced thickness as compared with the intrinsic amorphous silicon layer 20 (of FIG. 2A), and fabrication cost and fabrication time are reduced.

The buffer layer 103, the first impurity-doped amorphous silicon layer 105, the first inorganic insulating layer 108 and the intrinsic amorphous silicon layer 111 may be sequentially formed in a chemical vapor deposition (CVD) apparatus (not shown) by changing reaction gases injected into a chamber of the CVD apparatus.

Figure 4B:
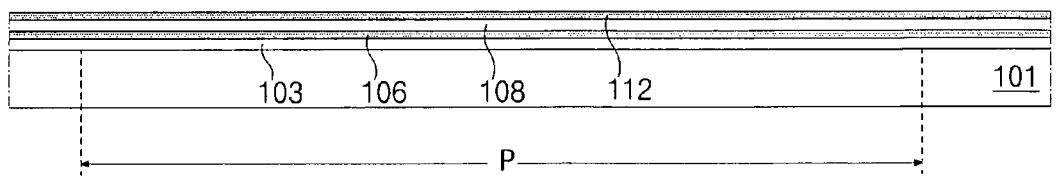
Figure 5B:
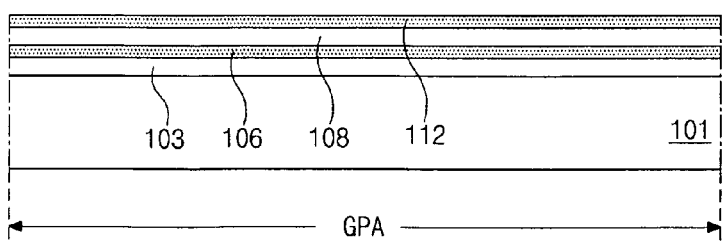
Figure 6B:
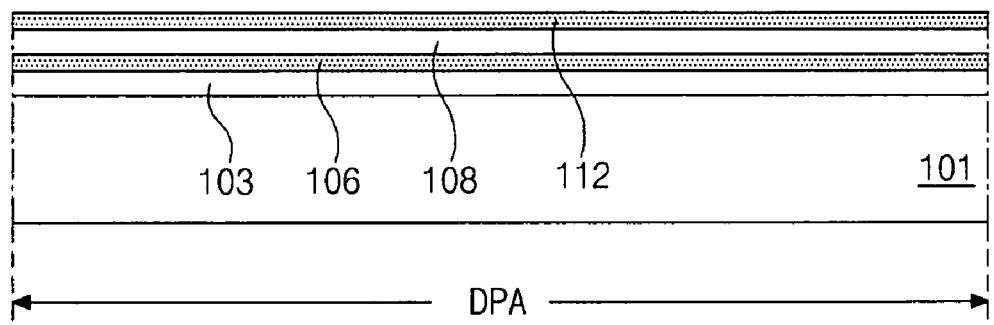

In FIGS. 4B, 5B and 6B, for the purpose of improving a mobility, the intrinsic amorphous silicon layer 111 (of FIGS. 4A, 5A and 6A) is crystallized by a solid phase crystallization (SPC) method to become an intrinsic polycrystalline silicon layer 112. For example, the intrinsic amorphous silicon layer 111 may be crystallized under a temperature of about 600° C. to about 700° C. in an alternating magnetic field crystallization (AMFC) apparatus.

Further, the impurity-doped amorphous silicon layer 105 (of FIGS. 4A, 5A and 6A) under the first inorganic insulating layer 108 (of FIGS. 4A, 5A and 6A) is also crystallized by the SPC method to become an impurity-doped polycrystalline silicon layer 106.

Figure 4C:
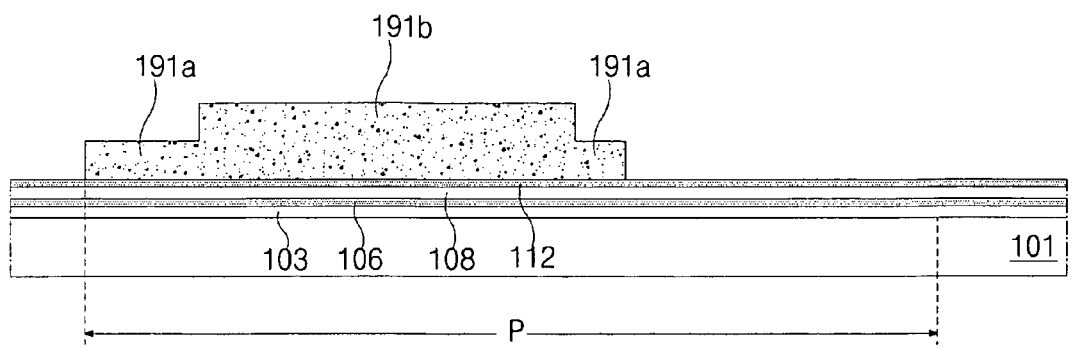
Figure 5C:
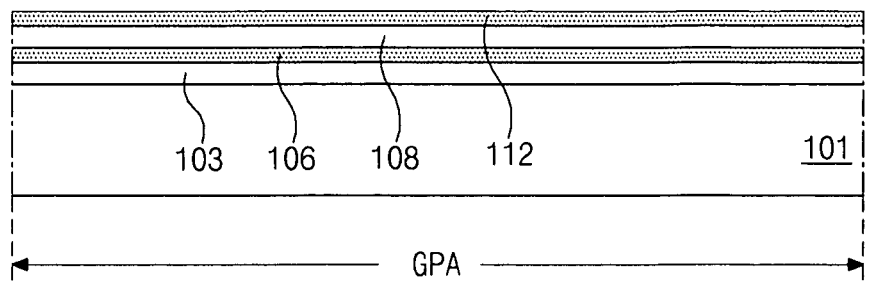
Figure 6C:
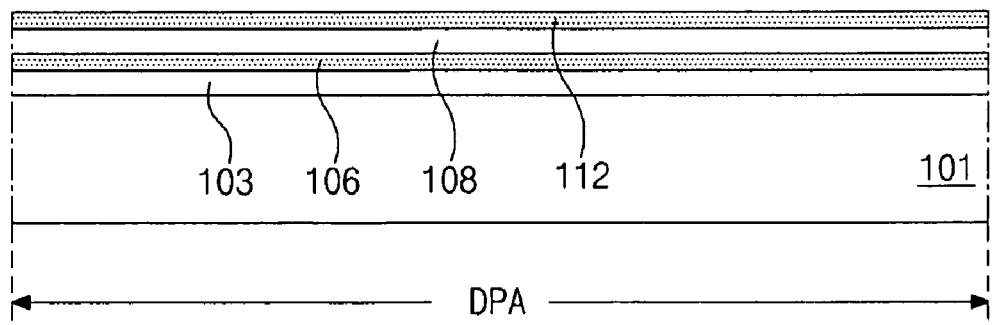

In FIGS. 4C, 5C and 6C, after a photoresist (PR) layer (not shown) is formed on the intrinsic polycrystalline silicon layer 112, a light is irradiated onto the PR layer through a photo mask (not shown) including a transmissive portion, a blocking portion and a half-transmissive portion. The transmittance of the half-transmissive portion is greater than the transmittance of the blocking portion and is smaller than the transmittance of the transmissive portion. For example, the half-transmissive portion may include a slit pattern or a multiple-coating layer. The step using the photo mask having the half-transmissive portion may be referred to as a diffraction exposure or a halftone exposure.

After the PR layer is exposed to the light, the PR layer is developed so that a first PR pattern 191a having a first thickness and a second PR pattern 191b having a second thickness greater than the first thickness can be formed in the pixel region P. The first and second PR patterns 191a and 191b are used for obtaining a stairs shape of a gate electrode 107 (of FIG. 4H), a gate insulating layer 110 (of FIG. 4H) and an active layer 115 (of FIG. 4H). The deterioration of an interlayer insulating layer 122 (of FIG. 4H) such as breakdown of the interlayer insulating layer 122 and void generation between the interlayer insulating layer 122 and the edge portions of the gate electrode 107 is prevented by the stairs shape. Accordingly, the first and second PR patterns 191a and 191b correspond to the gate electrode 107 formed in a subsequent step, and the second PR pattern 191b corresponds to an active layer 115 formed in a subsequent step. The first PR pattern 191a is disposed at both sides of the second PR pattern 191b.

Figure 4D:
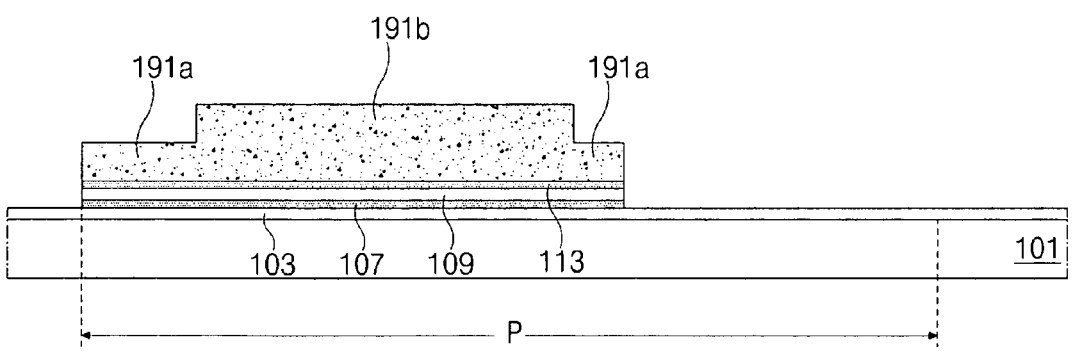
Figure 4E:
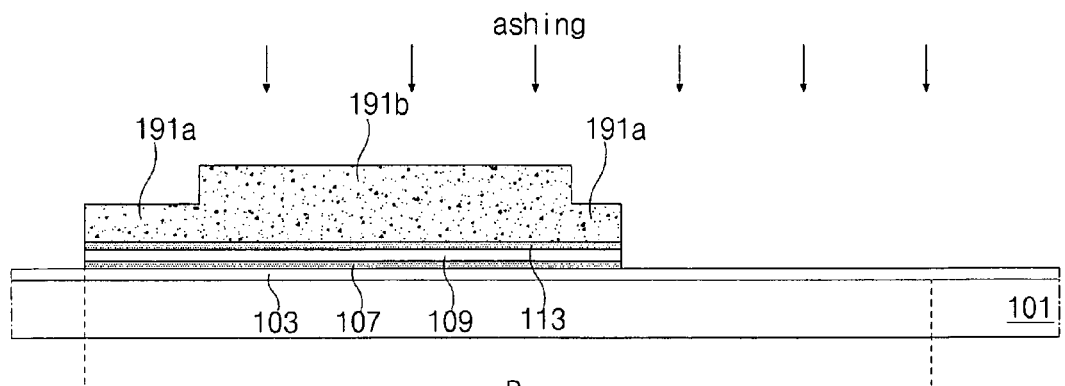
Figure 4F:
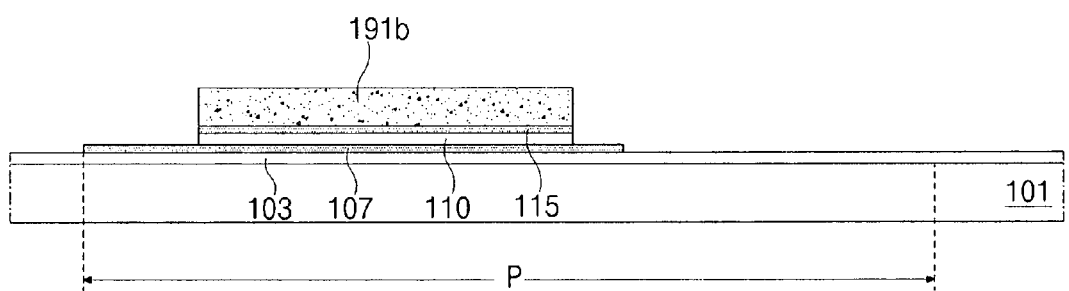
Figure 4G:
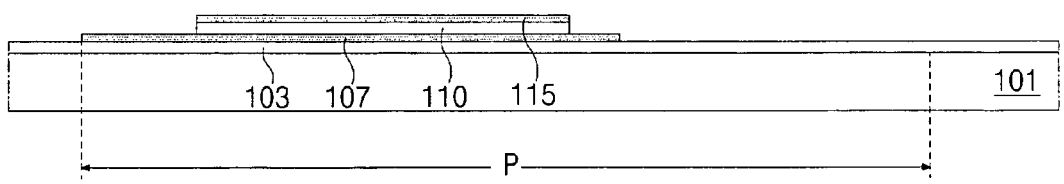
Figure 4H:
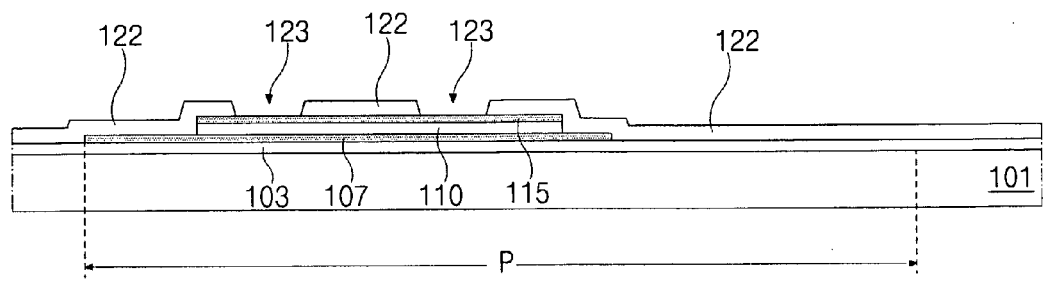
Figure 4I:
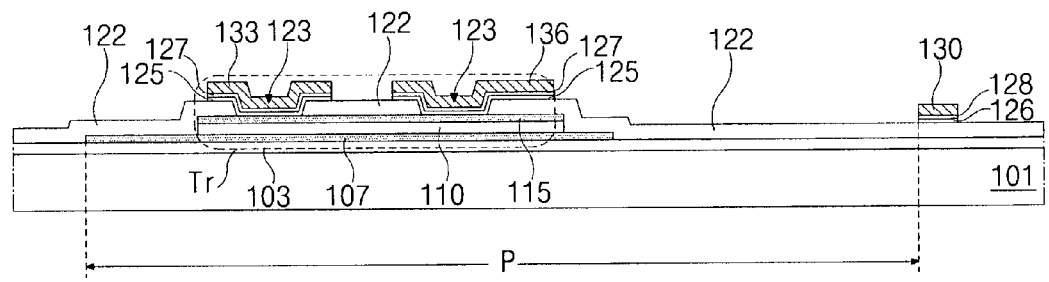
Figure 4J:
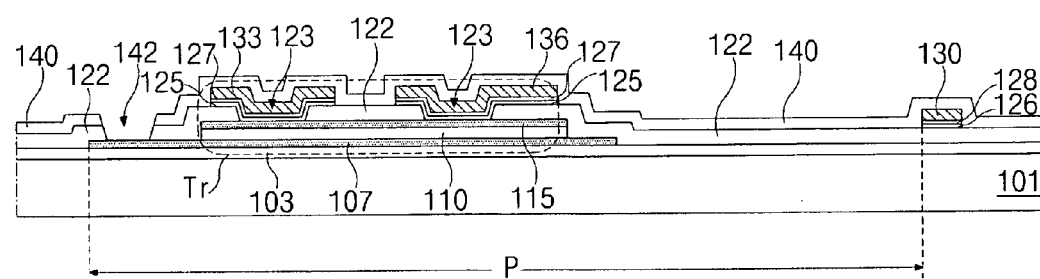
Figure 4K:
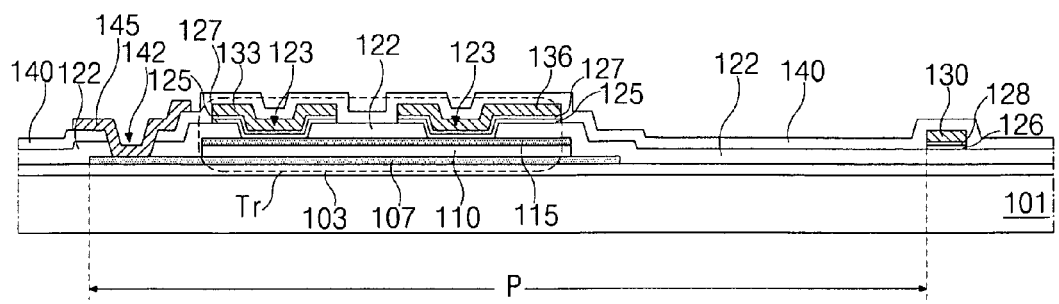
Figure 4L:
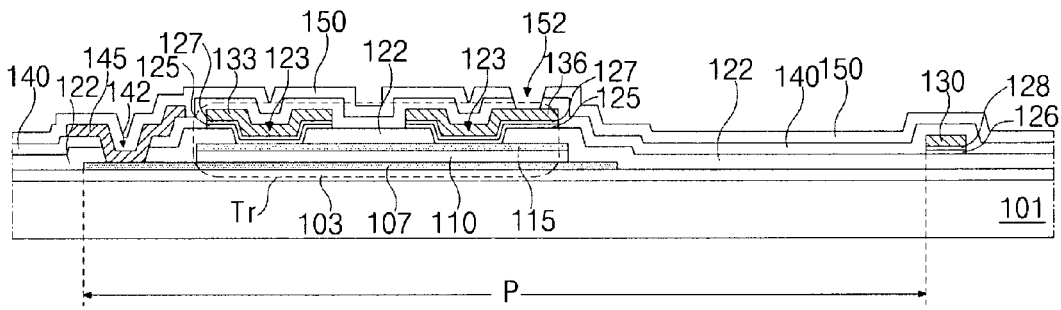
Figure 4M:
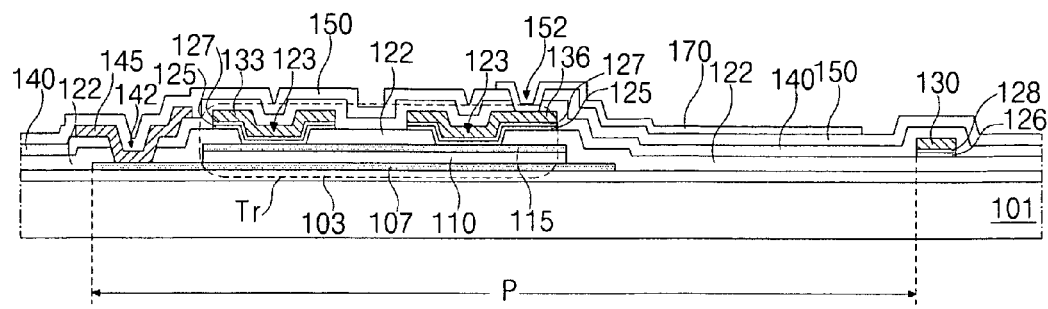

Further, the first and second PR patterns 191a and 191b are used for obtaining a contact area of the gate electrode 107 corresponding to a gate contact hole 142 (of FIG. 4M). Since the gate electrode 107 protrudes from and is exposed through the active layer 115, the gate contact hole 142 may be formed at an exposed portion of the gate electrode 107. For obtaining the contact area more stably, a width of one side of the exposed portion of the gate electrode 107 may be greater than a width of the other side of the exposed portion of the gate electrode 107.

As a result, the first PR pattern 191a is disposed on the intrinsic polycrystalline silicon layer 112 corresponding to the gate electrode 107 exposed through the active layer 115, and the second PR pattern 191b is disposed on the intrinsic polycrystalline silicon layer 112 corresponding to the active layer 115. In addition, the other portions of the intrinsic polycrystalline silicon layer 112 are exposed through the first and second PR patterns 191a and 191b.

Figure 5D:
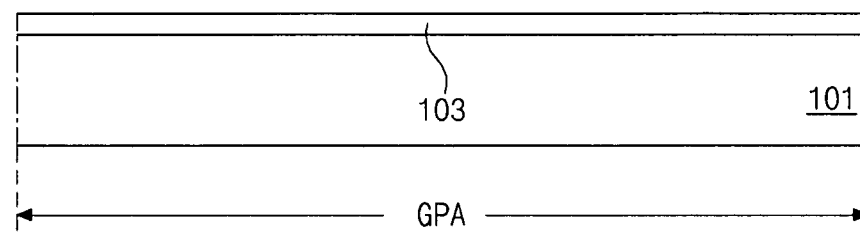
Figure 6D:
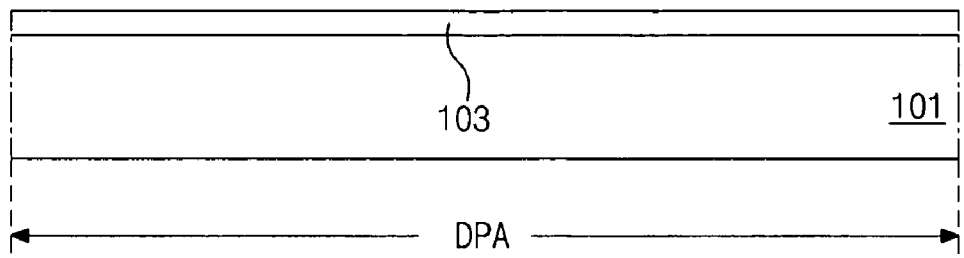

In FIGS. 4D, 5D and 6D, the intrinsic polycrystalline silicon layer 112 (of FIGS. 4C, 5C and 6C), the first inorganic insulating layer 108 (of FIGS. 4C, 5C and 6C) and the impurity-doped polycrystalline silicon layer 106 (of FIGS. 4C, 5C and 6C) are sequentially etched and removed using the first and second PR patterns 191a and 191b as an etching mask so that a gate electrode 107, an inorganic insulating pattern 109 and an intrinsic polycrystalline silicon pattern 113 can be formed on the buffer layer 103 in the pixel region P. The other portions of the buffer layer 103 are exposed.

Although the intrinsic polycrystalline silicon layer 112 (of FIGS. 4C, 5C and 6C), the first inorganic insulating layer 108 (of FIGS. 4C, 5C and 6C) and the impurity-doped polycrystalline silicon layer 106 (of FIGS. 4C, 5C and 6C) are selectively etched with respective etching gases, each of the intrinsic polycrystalline silicon layer 112, the first inorganic insulating layer 108 and the impurity-doped polycrystalline silicon layer 106 may be partially removed by the etching gases having selectivity. Accordingly, an undercut structure where an upper layer has a greater width than a lower layer may be obtained. For example, end lines of the intrinsic polycrystalline silicon layer 112, the first inorganic insulating layer 108 and the impurity-doped polycrystalline silicon layer 106 may not coincide with each other. However, the end portions having the undercut structure may be removed in a subsequent process in the present invention.

In a TFT having a bottom gate structure, the gate electrode of a metallic material, a gate insulating layer and an intrinsic amorphous silicon layer are sequentially formed on a substrate. Since the metallic material is susceptible to heat, the gate electrode of a metallic material having a thickness of about 1000 Å to about 2000 Å and including one of aluminum (Al), aluminum (Al) alloy, copper (Cu) and copper (Cu) alloy may be deteriorated in a step using the SPC method requiring a relatively high temperature. For example, a spiking of the gate electrode where the metallic material is diffused through the gate insulating layer to contact the intrinsic polycrystalline silicon layer may be generated. In the present invention, however, since the gate electrode 107 includes impurity-doped polycrystalline silicon instead of a metallic material having a relatively low resistance, the gate electrode 107 is not deteriorated even in a step using the SPC method.

Although the impurity-doped polycrystalline silicon has a conductivity smaller than the metallic material, the gate electrode 107 having a thickness of about 500 Å to about 1000 Å has a sheet resistance of about 150☐/sq to about 230☐/sq, which corresponds to a sheet resistance of a transparent conductive material such as indium-tin-oxide (ITO) and indium-zinc-oxide (IZO). Accordingly, impurity-doped polycrystalline silicon may be used for the gate electrode 107 in view of conductivity.

Figure 5E:
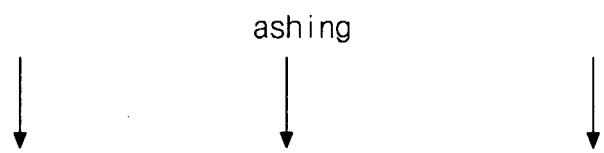
Figure 5E:
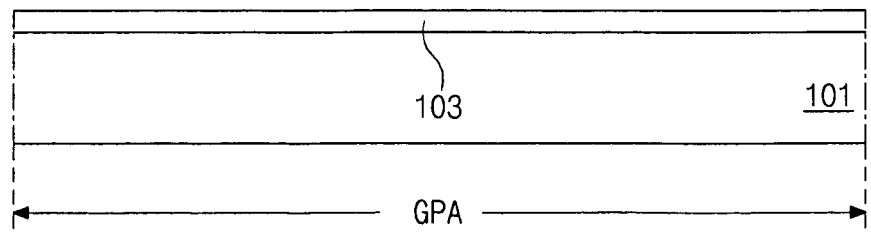
Figure 6E:
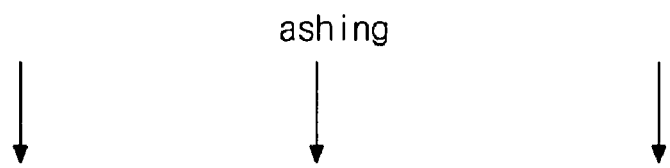

In FIGS. 4E, 5E and 6E, a step using an ashing method is performed for the substrate 101 having the gate electrode 107 of impurity-doped polycrystalline silicon, the inorganic insulating pattern 109 and the intrinsic polycrystalline silicon pattern 113. As a result, the first PR pattern 191a having the first thickness is completely removed and edge portions of the intrinsic polycrystalline silicon layer 113 is exposed through the second PR pattern 191b. Although the second PR pattern 191b is partially removed to have a reduced thickness, the second PR pattern 191b remains on the intrinsic polycrystalline silicon pattern 113.

Figure 5F:
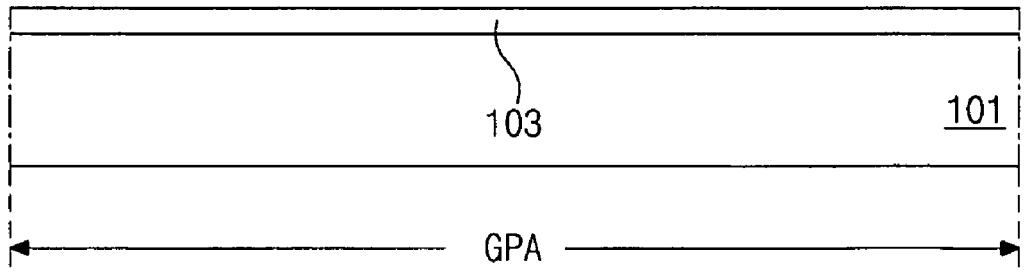
Figure 6F:
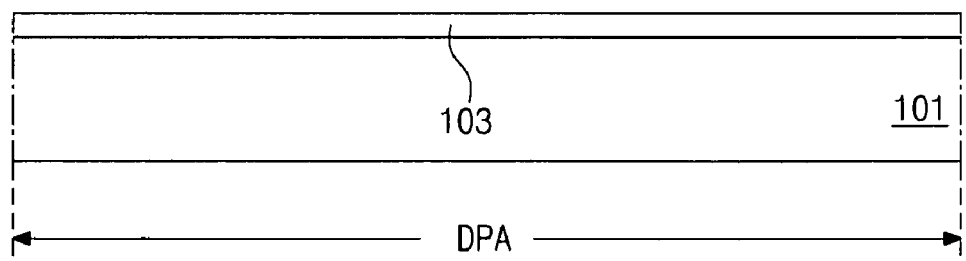

In FIGS. 4F, 5F and 6F, the intrinsic polycrystalline silicon pattern 113 (of FIGS. 4E, 5E and 6E) and the inorganic insulating pattern 109 (of FIGS. 4E, 5E and 6E) are sequentially etched using the second PR pattern 191b as an etching mask so that an active layer 115 of intrinsic polycrystalline silicon and a gate insulating layer 110 can be formed on the gate electrode 107. Edge portions of the gate electrode 107 are exposed through the active layer 115 and the gate insulating layer 110. Since the edge portions of the intrinsic polycrystalline silicon pattern 113 and the inorganic insulating pattern 109 are removed, the undercut structure obtained in a previous step is also removed.

The active layer 115 of intrinsic polycrystalline silicon overlaps and has the same area as the gate insulating layer 110. Accordingly, the gate electrode 107 of impurity-doped polycrystalline silicon is exposed through the active layer 115 of intrinsic polycrystalline silicon, and edge portions of the gate electrode 107, the gate insulating layer 110 and the active layer 115 constitute stairs shape in a cross-sectional view. In addition, one edge portion of the exposed gate electrode 107 may be larger than the other edge portion of the exposed gate electrode 107 for a gate contact hole formed in a subsequent step.

Figure 5G:
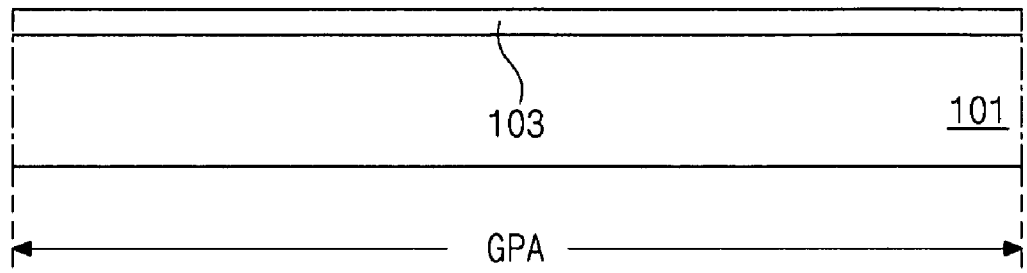
Figure 6G:
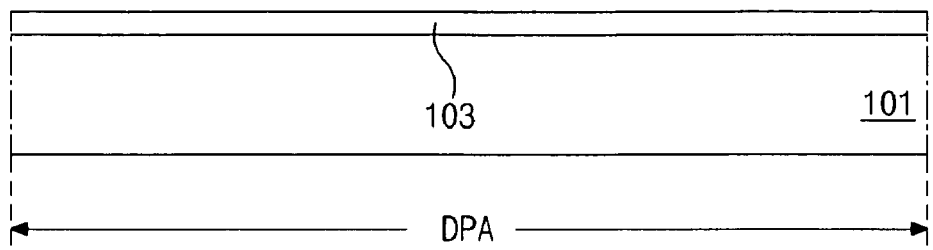

In FIGS. 4G, 5G and 6G, the second PR pattern 191b (of FIG. 4F) having the reduced thickness is removed through a step using a stripping method so that the active layer 115 of intrinsic polycrystalline silicon is exposed.

Figure 5H:
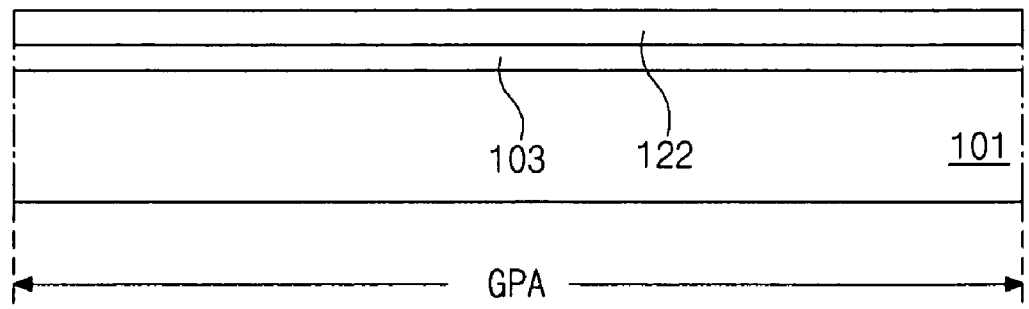
Figure 6H:
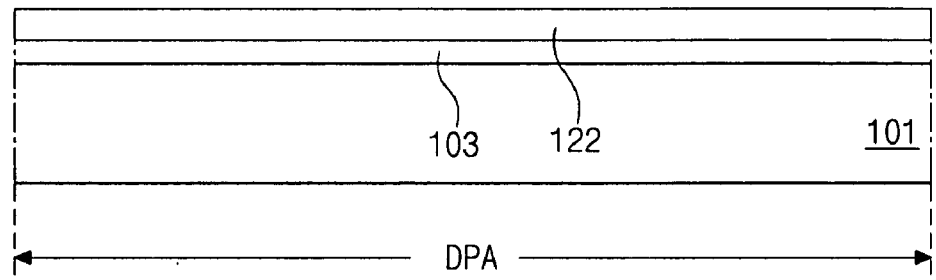

In FIGS. 4H, 5H and 6H, a second inorganic insulating layer (not shown) is formed on the active layer 115 of intrinsic polycrystalline silicon by depositing an inorganic insulating material such as silicon oxide ($SiO_2$) and silicon nitride (SiNx). The second inorganic insulating layer may have a single layer or a double layer. Since the total thickness of the gate electrode 107, the gate insulating layer 110 and the active layer 115 is over about 5000 Å, the laminated structure of the gate electrode 107, the gate insulating layer 110 and the active layer 115 generates a great step difference. However, since the edge portions of the gate electrode 107, the gate insulating layer 110 and the active layer 115 constitute a stairs shape in a cross-sectional view where the gate electrode 107 generates a first partial step difference and the gate insulating layer 110 and the active layer 115 generate a second partial step difference, the total step difference is mitigated. As a result, deterioration of the second inorganic insulating layer such as breakdown of the second inorganic insulating layer and void generation between the second inorganic insulating layer and the edge portions of the gate electrode 107 is prevented, and step coverage of the second inorganic insulating layer is improved.

Next, an interlayer insulating layer 122 having two active contact holes 123 is formed through a mask process including coating, exposure using a photo mask, development, etching and stripping. The active layer 115 is exposed through the two active contact holes 123, and the interlayer insulating layer 122 between the two active contact holes 123 functions as an etch stopper protecting the active layer 115 in a step of etching. A thickness of the interlayer insulating layer 122 may be greater than a sum of thicknesses of the gate electrode 107 and the gate insulating layer 110 for further preventing the deterioration of the interlayer insulating layer 122.

Figure 5I:
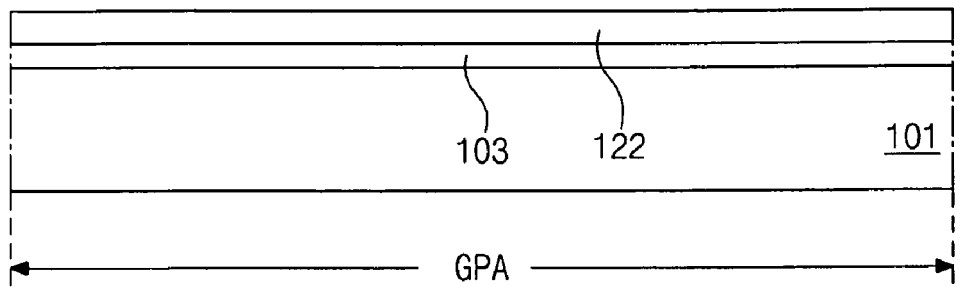
Figure 6I:
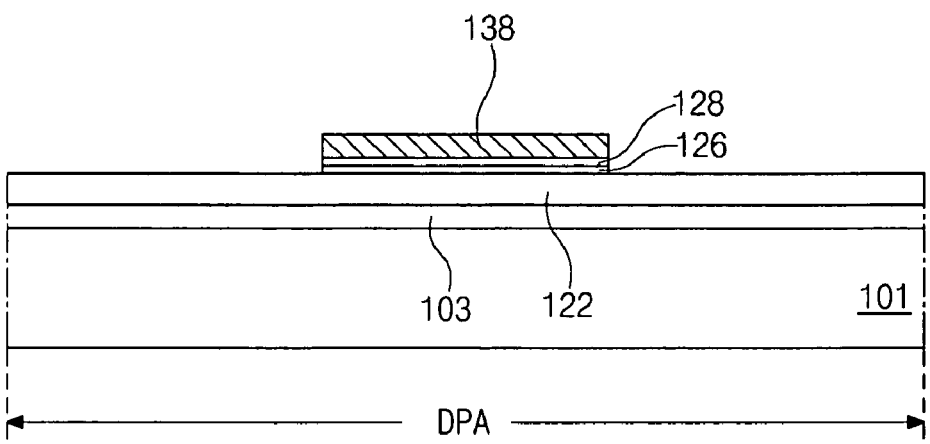

In FIGS. 4I, 5I and 6I, a barrier layer (not shown) of intrinsic amorphous silicon, a second impurity-doped amorphous silicon layer (not shown) and a first metal layer (not shown) are sequentially formed on the interlayer insulating layer 122. For example, the barrier layer may have a thickness of about 50 Å to about 100 Å and the second impurity-doped amorphous silicon layer may have a thickness of about 100 Å to about 300 Å. The first metal layer may include at least one of molybdenum (Mo), chromium (Cr) and molybdenum titanium (MoTi). Since an interface between intrinsic polycrystalline silicon and intrinsic amorphous silicon has a contact property such as a contact resistance better than an interface between intrinsic polycrystalline silicon and impurity-doped amorphous silicon, the barrier layer is formed to improve the contact property between the active layer 115 and the second impurity-doped amorphous silicon layer.

Next, the first metal layer, the second impurity-doped amorphous silicon layer and the barrier layer are sequentially etched through a mask process so that a source electrode 133, a drain electrode 136 spaced apart from the source electrode 133, a data line 130 and a data pad 138 can be formed over the interlayer insulating layer 122. The data line 130 is disposed in a boundary portion of the pixel region P, and the data pad 138 connected to the data line 130 is disposed at an end portion of the data line 130 in the data pad area DPA. Although not shown in FIG. 4I, the source electrode 133 is connected to the data line 130.

In addition, source and drain ohmic contact layers 127 of impurity-doped amorphous silicon and source and drain barrier patterns 125 of intrinsic amorphous silicon are sequentially formed under the source and drain electrodes 133 and 136, respectively, and a second dummy pattern 128 of impurity-doped amorphous silicon and a first dummy pattern 126 of intrinsic amorphous silicon are sequentially formed under the data line 130. The source and drain barrier patterns 125 are spaced apart from each other, and the source and drain ohmic contact layers 127 are spaced apart from each other. Further, the source and drain electrodes 133 and 136 are spaced apart from each other. Each of the source ohmic contact layer 127 and the source barrier pattern 125 has the same shape as the source electrode 133 such that end lines of each of the source ohmic contact layer 127 and the source barrier pattern 125 coincide with an end line of the source electrode 133. Each of the drain ohmic contact layer 127 and the drain barrier patterns 125 has the same shape as the drain electrode 136 such that end lines of each of the drain ohmic contact layer 127 and the drain barrier pattern 125 coincide with an end line of the drain electrode 136. The source and drain barrier patterns 125 of intrinsic amorphous silicon contact the active layer 115 of intrinsic polycrystalline silicon through the active contact holes 123.

Since the interlayer insulting layer 122 corresponding to a central portion of the active layer 115 between the two active contact holes 123 functions as an etch stopper during the step of forming the data line 130, the source and drain electrodes 133 and 136, the source and drain ohmic contact layers 127 and the source and drain barrier patterns 125, the active layer 115 of intrinsic polycrystalline silicon is not etched while the source and drain electrodes 133 and the 136, the source and drain ohmic contact layers 127 and the source and drain barrier patterns 125 are etched by a dry etching method. As a result, deterioration such as a surface damage of the active layer 115 due to the dry etching step for the source and drain electrodes 133 and 136 is prevented.

For example, after the data line 130 and the source and drain electrodes 133 and 136 are formed by patterning the first metal layer, the second impurity-doped amorphous silicon layer and the barrier layer may be patterned by a dry etching method. Since the interlayer insulating layer 122 is formed on the active layer 115 between the source and drain electrodes 133 and 136 in the pixel region, the active layer 115 of intrinsic polycrystalline silicon is never influenced by the dry etching method. Accordingly, the active layer 115 does not have a surface damage while the second impurity-doped amorphous silicon layer and the barrier layer are patterned by the dry etching method for the source and drain ohmic contact layers 127 and the source and drain barrier patterns 125. Further, since the thickness of the active layer 115 is not reduced, the active layer 115 of intrinsic polycrystalline silicon has a uniform thickness in the pixel region P.

The gate electrode 107 of impurity-doped polycrystalline silicon, the gate insulating layer 110, the active layer 115 of intrinsic polycrystalline silicon, the interlayer insulating layer 122, the source and drain barrier patterns 125 of intrinsic amorphous silicon, the source and drain ohmic contact layers 127 of impurity-doped amorphous silicon, the source and drain electrodes 133 and 136 constitute a thin film transistor (TFT) Tr.

Although not shown in FIGS. 4I, 5I and 6I, when the substrate 101 is used as an array substrate for an organic electroluminescent display device, a power line may be formed to be spaced apart from and parallel to the data line 130. The power line may have the same layer as the data line 130. In addition, a plurality of driving TFT each having the same structure as the TFT Tr may be formed in the pixel region P.

Figure 5J:
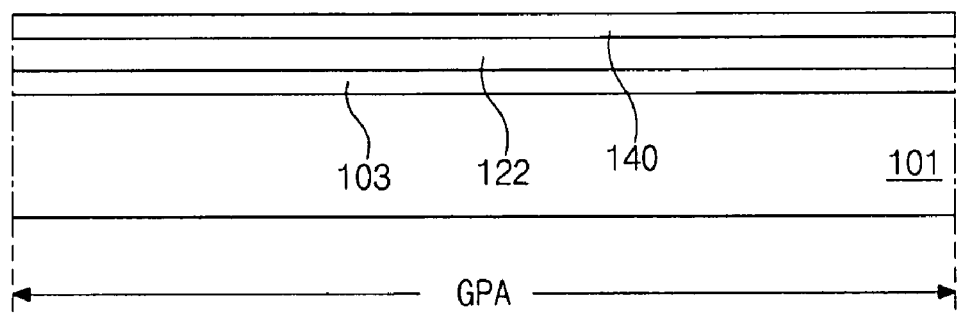
Figure 6J:
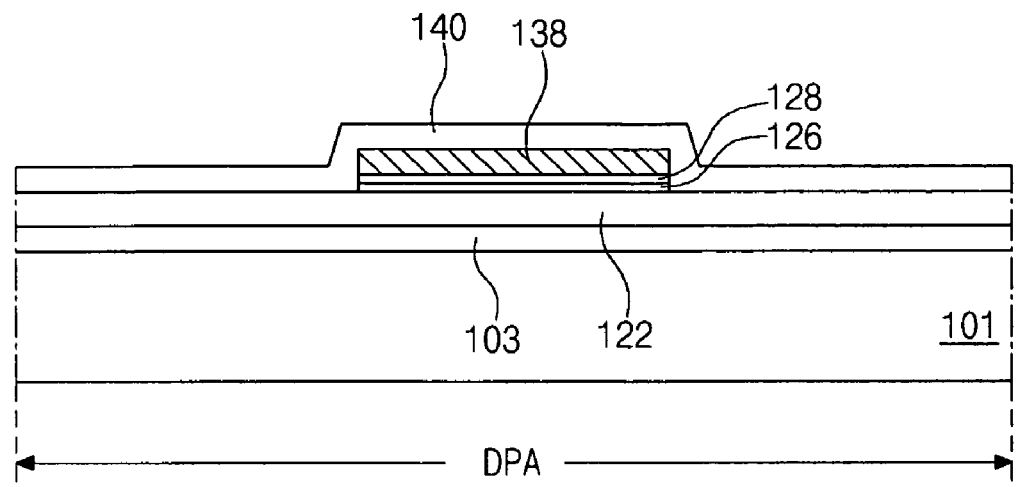

In FIGS. 4J, 5J and 6J, a first passivation layer 140 is formed on the data line 130, the data pad 138, the source electrode 133 and the drain electrode 136 by depositing an inorganic insulating material such as silicon oxide (SiO$_2$) and silicon nitride (SiNx). The first passivation layer 140 and the interlayer insulating layer 122 include a gate contact hole 142 exposing the gate electrode 107.

Figure 5K:
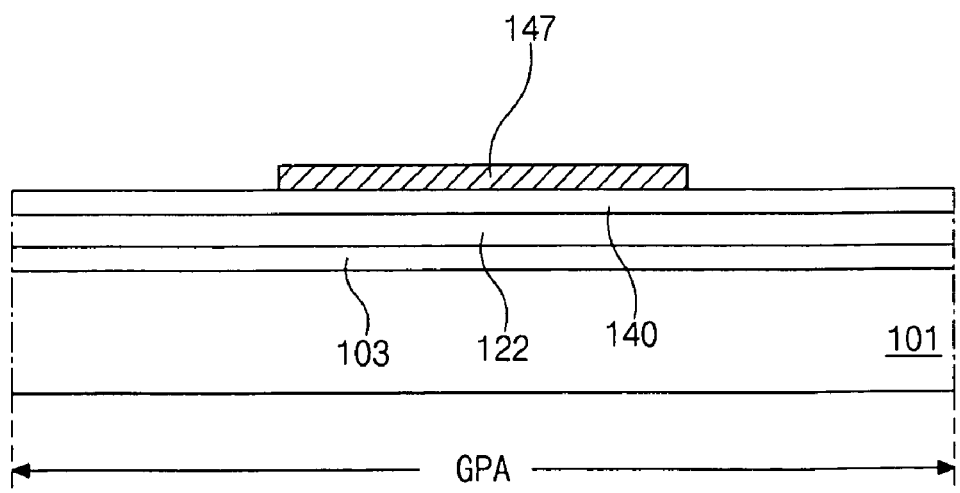
Figure 6K:
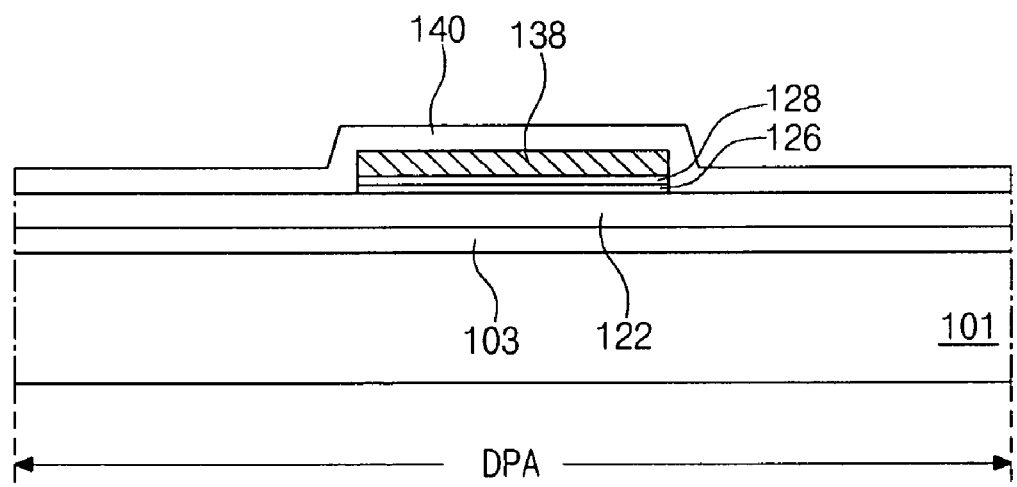

In FIGS. 4K, 5K and 6K, after a second metal layer (not shown) is formed on the first passivation layer 140, a gate line 145 and a gate pad 147 are formed on the passivation layer by patterning the second metal layer. The second metal layer may include at least one of aluminum (Al), aluminum alloy such as aluminum neodymium (AlNd), copper (Cu), copper alloy, molybdenum (Mo) and chromium (Cr). The gate line 145 is connected to the gate electrode 107 through the gate contact hole 142 and crosses the data line 130 to define the pixel region P. In addition, the gate pad 147 at an end portion of the gate line 145 in the gate pad area GPA is connected to the gate line 145. Although the gate line 145 and the gate pad 147 includes a single layer of a metallic material in FIGS. 4K, 5K and 6K, the gate line 145 and the gate pad 147 may include a double layer or a triple layer of different metallic materials in another embodiment. For example, a double layer of aluminum neodymium and molybdenum (AlNd/Mo) or a triple layer of molybdenum, aluminum neodymium and molybdenum (Mo/AlNd/Mo) may be used for the gate line 145 and the gate pad 147.

Figure 5L:
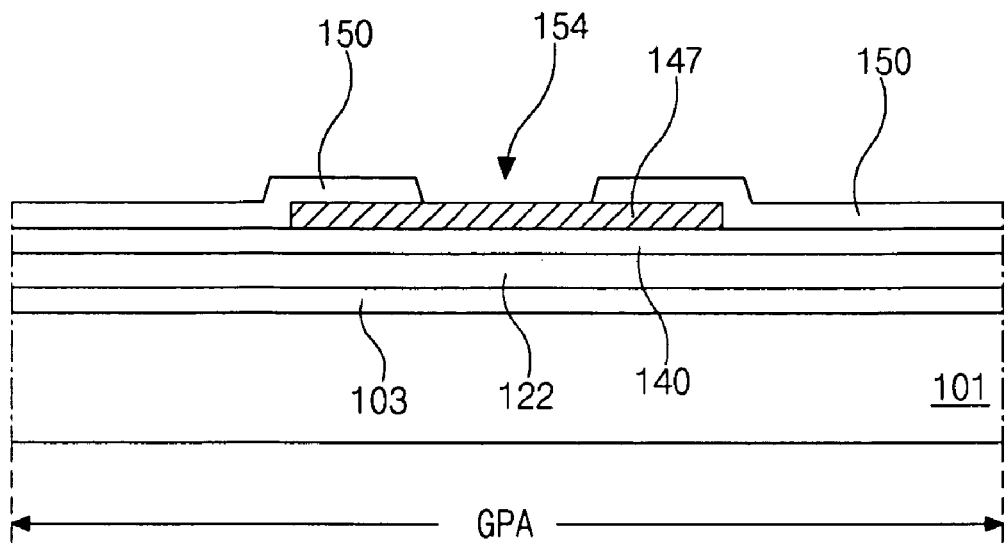
Figure 6L:
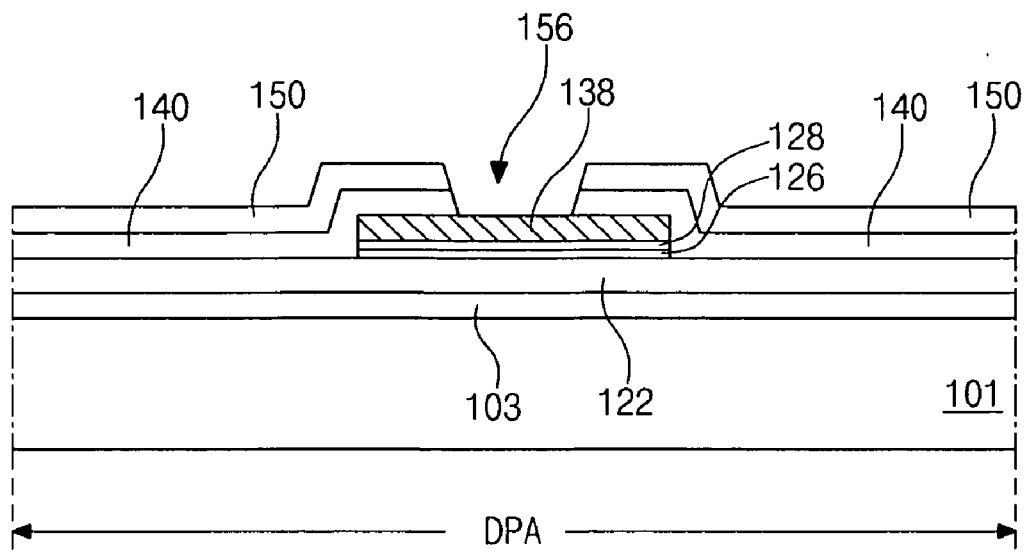

In FIGS. 4L, 5L and 6L, a second passivation layer 150 is formed on the gate line 145 and the gate pad 147 by depositing an inorganic insulating material such as silicon oxide (SiO$_2$) and silicon nitride (SiNx). The second passivation layer 150 and the first passivation layer 140 include a drain contact hole 152 exposing the drain electrode 136 in the pixel region P and a data pad contact hole 156 exposing the data pad 138 in the data pad area DPA, and the second passivation layer 150 includes a gate pad contact hole 154 exposing the gate pad 147 in the gate pad area GPA.

Figure 5M:
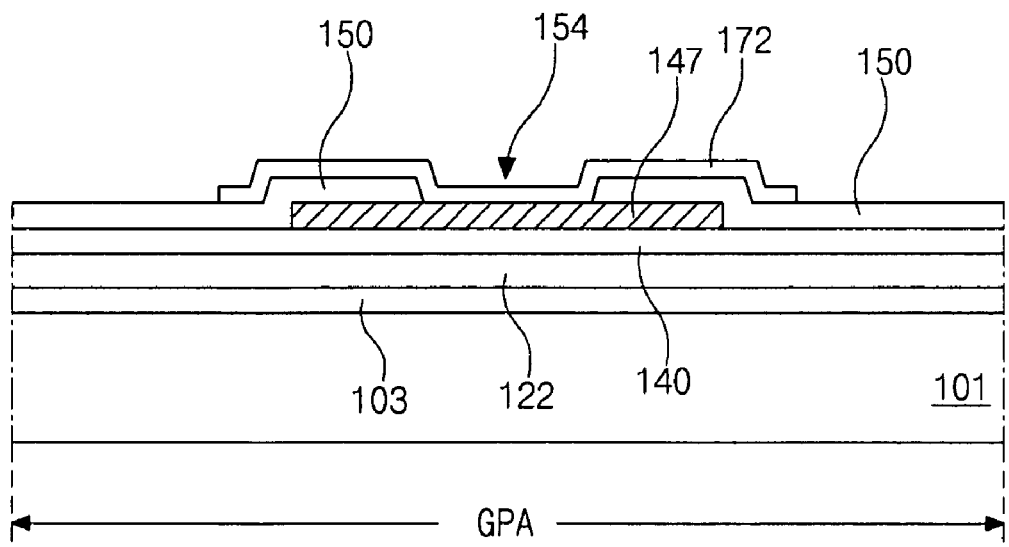
Figure 6M:
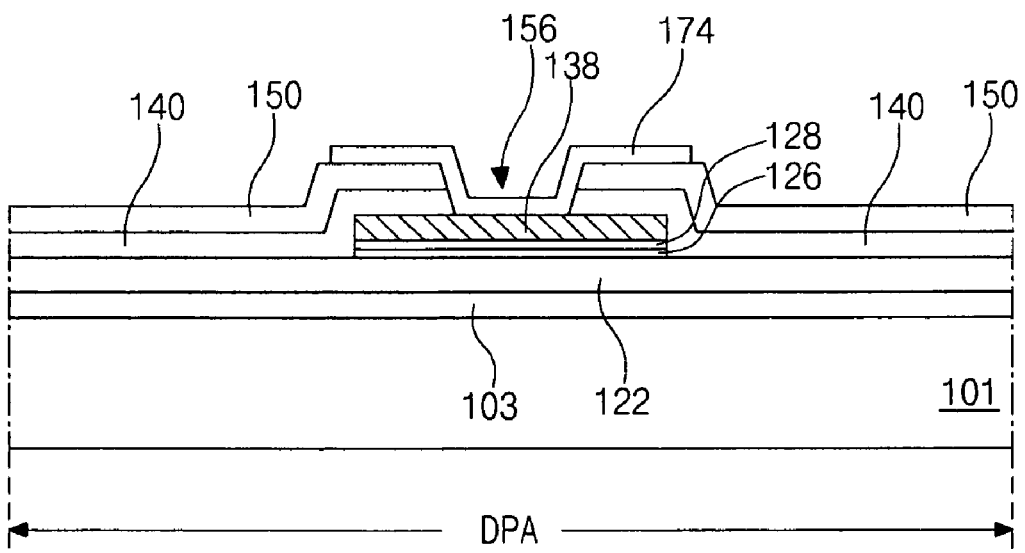

In FIGS. 4M, 5M and 6M, a pixel electrode 170, a gate pad terminal 172 and a data pad terminal 174 are formed on the second passivation layer 150 by depositing and patterning a transparent conductive material such as indium-tin-oxide (ITO) and indium-zinc-oxide (IZO). The pixel electrode 170 is connected to the drain electrode 136 through the drain contact hole 152. In addition, the gate pad terminal 172 is connected to the gate pad 147 through the gate pad contact hole 154, and the data pad terminal 174 is connected to the data pad 138 through the data pad contact hole 156.

Although not shown, in an array substrate for an organic electroluminescent display device, a switching TFT and a driving TFT are formed in a pixel region defined by a gate line and a data line. A gate electrode of the switching TFT is connected to the gate line, and a source electrode of the switching TFT is connected to the data line. A drain electrode of the switching TFT is connected to a gate electrode of the driving TFT. A source electrode of the driving TFT is connected to a power line, and a drain electrode of the driving TFT is connected to an organic electroluminescent diode.

Figure 7A:
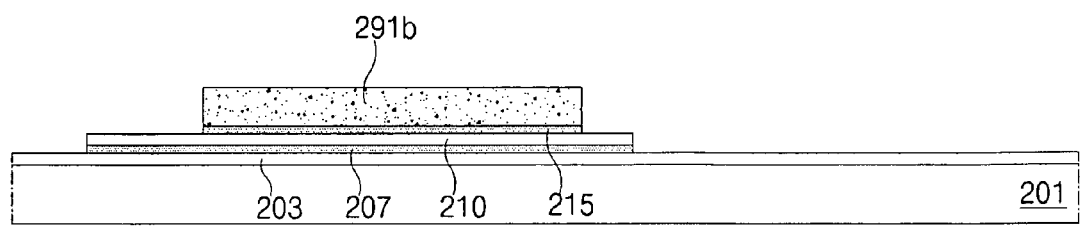
FIGS. 7A and 7B are cross-sectional views showing a method of fabricating an array substrate having a pixel region according to a second embodiment of the present invention.
Figure 7B:
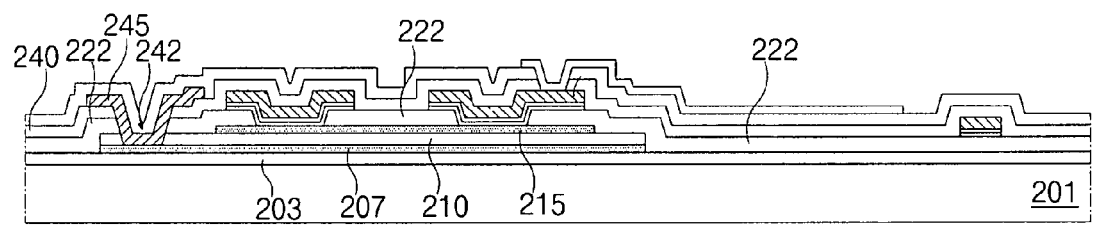

FIGS. 7A and 7B are cross-sectional views showing a method of fabricating an array substrate having a pixel region according to a second embodiment of the present invention. Since structures of a gate pad area and a data pad area of the second embodiment are similar to those of the first embodiment, the structures of the gate pad area and the data pad area are omitted.

In FIGS. 7A and 7B, a buffer layer 203 is formed on a substrate 201 and a gate electrode 207 is formed on the buffer layer 203. A gate insulating layer 210 has the same shape and the same area as the gate electrode 207 of impurity-doped polycrystalline silicon. In addition, an active layer 215 of intrinsic polycrystalline silicon over the gate insulating layer 210 is patterned using a second PR pattern 291b and has a smaller width than the gate insulating layer 210 and the gate electrode 207. A gate contact hole 242 exposing the gate electrode 207 is formed in the gate insulating layer 210, an interlayer insulating layer 222 and a first passivation layer 240, and a gate line 245 is connected to the gate electrode 207 through the gate contact hole 242.

Since the edge portions of the gate electrode 207, the gate insulating layer 210 and the active layer 215 constitute a stairs shape in a cross-sectional view where the gate electrode 207 and the gate insulating layer 210 generate a first partial step difference and the active layer 215 generates a second partial step difference, the total step difference of the gate electrode 207, the gate insulating layer 210 and the active layer 215 is mitigated. As a result, deterioration of the interlayer insulating layer 222 such as breakdown of the interlayer insulating layer 222 and void generation between the interlayer insulating layer 222 and the edge portions of the gate electrode 207 is prevented, and a step coverage of the interlayer insulating layer 222 is improved.

Further, since the gate insulating layer 210 has the same shape and the same area as the gate electrode 207, a gate contact hole 242 exposing the gate electrode 207 is formed through a first passivation layer 240, the interlayer insulating layer 222 and the gate insulating layer 210.

In an array substrate according to the present invention, since an active layer of a thin film transistor of is not exposed to an etching gas during a dry etching step, deterioration in characteristics of the thin film transistor is prevented. In addition, since the active layer is not etched in the dry etching step, a thickness of the active layer is reduced and productivity is improved due to reduction in deposition time for the active layer. On the other hand, since the thin film transistor includes a semiconductor layer of polycrystalline silicon, a mobility of the thin film transistor is improved. Further, since a doping step for impurities is not used, an apparatus for the doping step is not required and cost for the apparatus is reduced. Moreover, since the thin film transistor includes a gate electrode of impurity-doped polycrystalline silicon, deterioration of the gate electrode such as a spiking is prevented. Finally, since the gate electrode, the gate insulating layer and the active layer have a stairs shape, step coverage of an interlayer insulating layer is improved and deterioration such as breakdown of the interlayer insulating layer and a void between the interlayer insulating layer and the gate electrode is prevented, thereby production yield improved.

In the first and second embodiments of the present invention, the gate electrode is formed of impurity-doped polycrystalline silicon. In another embodiment, the gate electrode may be formed of a metallic material having a relatively thin thickness and a relatively high melting temperature.

An array substrate according to a third embodiment of the present invention has the same shape as an array substrate according to each of the first and second embodiments of the present invention. Further, in a method of fabricating an array substrate according to a third embodiment of the present invention, after a buffer layer is formed on a substrate, a meta layer is formed on the buffer layer in a sputtering apparatus, and an inorganic insulating layer and an intrinsic amorphous silicon layer are sequentially formed on the metal layer by depositing an inorganic insulating material and intrinsic silicon in a chemical vapor deposition (CVD) apparatus. Since the subsequent steps to the intrinsic amorphous silicon layer of the third embodiment are the same as the steps of each of the first and second embodiments, drawings are omitted.

In general, since an active layer is formed after a gate electrode is formed in an array substrate having a thin film transistor of a bottom gate structure, the gate electrode of a metallic material may be deteriorated during an SPC step of about 600° C. to about 700° C. for crystallization of the active layer. In an array substrate according to the third embodiment of the present invention, however, since the gate electrode is formed of a metallic material satisfying a specific condition, deterioration of the gate electrode of the metallic material is prevented.

First, the metallic material for the gate electrode may have a melting temperature higher than the temperature of the SPC step. Preferably, the metallic material may have a melting temperature over about 1000° C. to prevent melting or diffusion of the metallic material during the SPC step of about 600° C. to about 700° C. For example, when the gate electrode is formed of aluminum (Al) alloy, the gate electrode may have random voids therein after the SPC step. The random voids may cause deviation in resistance of the gate electrode and an operational property of a thin film transistor (TFT) is deteriorated due to the deviation. Moreover, since the random voids may accelerate deterioration speed of the TFT, the lifetime of the TFT is reduced.

Second, the gate electrode of the metallic material may have a thickness within a range of about 100 Å to about 1000 Å, preferably, a range of about 100 Å to about 500 Å. The gate electrode of the metallic material may be swelled or contracted during the SPC step even when the metallic material has a melting temperature higher than about 1000° C. Since the swelling and the contracting of the gate electrode cause deformation of the substrate, the gate electrode may have a thickness smaller than a critical thickness, for example, about 1000 Å, that causes the deformation. In addition, the gate electrode may have a thickness greater than a minimum thickness, for example, about 100 Å, where the gate electrode of the metallic material has a resistance similar to the impurity-doped polycrystalline silicon, so that the gate electrode can transmit a gate signal without delay.

Accordingly, the gate electrode includes a metallic material having a melting temperature higher than the temperature of the SPC step. For example, at least one of molybdenum (Mo), molybdenum alloy such as molybdenum titanium (MoTi) and copper (Cu) may be used for the gate electrode. Although one of molybdenum (Mo), molybdenum (Mo) alloy and copper (Cu) has a relatively high resistivity, the gate electrode including one of molybdenum (Mo), molybdenum (Mo) alloy and copper (Cu) is hardly deformed and a void is not generated therein even at a temperature higher than the temperature of the SPC step and lower than the melting temperature. In addition, the swelling and the contracting due to rapid temperature change are relatively small in the gate electrode including one of molybdenum (Mo), molybdenum (Mo) alloy and copper (Cu).

Although one of chromium (Cr) and titanium (Ti) has a melting temperature higher than about 1000° C., a void is generated in the gate electrode including one of chromium (Cr) and titanium (Ti) after the SPC step of 600° C. to about 700° C. In addition, since the swelling and the contracting due to rapid temperature change are relatively great, the substrate having the gate electrode of about 100 Å to about 1000 Å is deformed.

When the gate electrode of at least one of molybdenum (Mo), molybdenum (Mo) alloy and copper (Cu) has a thickness greater than about 1000 Å, the substrate having the gate electrode is deformed after the SPC step is performed for an inorganic insulating layer on the gate electrode and an intrinsic amorphous silicon layer on the inorganic insulating layer. Further, when the gate electrode of at least one of molybdenum (Mo), molybdenum (Mo) alloy and copper (Cu) has a thickness smaller than about 100 Å, the gate electrode has a resistivity greater than the impurity-doped polycrystalline silicon.

As a result, the gate electrode may include at least one of molybdenum (Mo), molybdenum (Mo) alloy such as molybdenum titanium (MoTi) and copper (Cu) and may have a thickness of about 100 Å to about 1000 Å.

Since the structure of the array substrate according to a third embodiment is the same as the structure of the array substrate according to the first and second embodiments, illustration regarding the structure will be omitted. In addition, since the method of fabricating the array substrate according to the third embodiment similar to the method of fabricating the array substrate according to the first and second embodiments, the difference in the fabrication method will be illustrated.

In the first and second embodiments, the buffer layer, the impurity-doped amorphous silicon layer, the inorganic insulating layer and the intrinsic amorphous silicon layer are sequentially formed in the chamber of the CVD apparatus. In the third embodiment, after a buffer layer of an inorganic insulating material is formed on a substrate in a chamber of a CVD apparatus, the substrate having the buffer layer is transferred to a chamber of a sputtering apparatus and a gate metal layer is formed on the buffer layer. The gate metal layer may include a single layer or a multiple layer of at least one of molybdenum (Mo), molybdenum (Mo) alloy and copper (Cu) having a thickness of about 100 Å to about 1000 Å. After the substrate having the gate metal layer is transferred to a chamber of a CVD apparatus again, an inorganic insulating layer and an intrinsic amorphous silicon layer are sequentially formed on the gate metal layer by depositing an inorganic insulating material and an intrinsic amorphous silicon.

Next, the subsequent steps including the SPC step similar to those of the first and second embodiments are performed and the substrate having the gate electrode of at least one of molybdenum (Mo), molybdenum (Mo) alloy and copper (Cu) is completed.

In the array substrate according to the third embodiment, since the gate electrode includes at least one of molybdenum (Mo), molybdenum (Mo) alloy and copper (Cu) having a thickness of about 100 Å to about 1000 Å, the deformation of the substrate is prevented during the SPC step. In addition, since the resistivity of the gate electrode of the third embodiment is lower than the resistivity of the gate electrode of the first and second embodiments, the contact resistance to the gate line is reduced. Accordingly, the driving voltage for the thin film transistor is reduced and the power consumption is reduced. Further, since the semiconductor layer is blocked by the gate electrode of an opaque metallic material, the photo current in the semiconductor layer is prevented and a property of on/off current is improved.

It will be apparent to those skilled in the art that various modifications and variations can be made in the driving system and method of the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate for a display device, comprising:
    forming a buffer layer on a substrate having a pixel region;
    sequentially forming a gate electrode of impurity-doped polycrystalline silicon, a gate insulating layer and an active layer of intrinsic polycrystalline silicon on the buffer layer in the pixel region, edge portions of the gate electrode exposed through the active layer;
    forming an interlayer insulating layer of an inorganic insulating material on the active layer, the interlayer insulating layer including active contact holes exposing the active layer;
    sequentially forming a source barrier pattern, a source ohmic contact layer and a source electrode on the interlayer insulating layer, sequentially forming a drain barrier pattern, a drain ohmic contact layer and a drain electrode on the interlayer insulating layer, and sequentially forming a first dummy pattern, a second dummy pattern and a data line on the interlayer insulating layer, wherein the source barrier pattern, the drain barrier pattern and the first dummy pattern include intrinsic amorphous silicon, wherein the source ohmic contact layer, the drain ohmic contact layer and the second dummy pattern include impurity-doped amorphous silicon, wherein the source and drain barrier patterns are connected to the active layer through the active contact holes, and wherein the data line is connected to the source electrode;
    forming a first passivation layer on a surface of the interlayer insulating layer including the source electrode, the drain electrode and the data line formed thereon, the first passivation layer and the interlayer insulating layer including a gate contact hole exposing the gate electrode;
    forming a gate line on the first passivation layer, the gate line connected to the gate electrode through the gate contact hole and crossing the data line to define the pixel region;
    forming a second passivation layer on a surface of the first passivation layer including the gate line formed thereon, the second passivation layer and the first passivation layer including a drain contact hole exposing the drain electrode; and
    forming a pixel electrode on the second passivation layer, the pixel electrode connected to the drain electrode through the drain contact hole.

2. The method according to claim 1, wherein the gate insulating layer has a same area as the active layer.

3. The method according to claim 2, wherein forming the gate electrode, the gate insulating layer and the active layer on the buffer layer comprises:
    sequentially forming an impurity-doped amorphous silicon layer, an inorganic insulating layer and an intrinsic amorphous silicon layer on the buffer layer;
    crystallizing the impurity-doped amorphous silicon layer and the intrinsic amorphous silicon layer through a solid phase crystallization method to form an impurity-doped polycrystalline silicon layer on the buffer layer and an intrinsic polycrystalline silicon layer on the inorganic insulating layer;
    forming a first photoresist pattern having a first thickness and a second photoresist pattern having a second thickness greater than the first thickness on the intrinsic polycrystalline silicon layer, wherein the first photoresist pattern is disposed at both sides of the second photoresist pattern, wherein the first and second photoresist patterns correspond to the gate electrode, and the second photoresist pattern corresponds to the active layer;
    sequentially etching the intrinsic polycrystalline silicon layer, the inorganic insulating layer and the impurity-doped polycrystalline silicon layer using the first and second photoresist patterns as a first etching mask to form the gate electrode on the buffer layer, an inorganic insulating pattern on the gate electrode and an intrinsic polycrystalline silicon pattern on the inorganic insulating pattern;
    removing the first photoresist pattern to expose edge portions of the intrinsic polycrystalline silicon pattern;
    sequentially etching the intrinsic polycrystalline silicon pattern and the inorganic insulating pattern using the second photoresist pattern as a second etching mask to form the gate insulating layer on the gate electrode and the active layer on the gate insulating layer; and
    removing the second photoresist pattern.

4. The method according to claim 3, wherein the solid phase crystallization method includes a heat treatment of a temperature of about 600° C. to about 700° C. in an alternating magnetic field crystallization (AMFC) apparatus.

5. The method according to claim 1, wherein the gate insulating layer has a same area as the gate electrode.

6. The method according to claim 5, wherein forming the gate electrode, the gate insulating layer and the active layer on the buffer layer comprises:
    sequentially forming an impurity-doped amorphous silicon layer, an inorganic insulating layer and an intrinsic amorphous silicon layer on the buffer layer;
    crystallizing the impurity-doped amorphous silicon layer and the intrinsic amorphous silicon layer through a solid phase crystallization method to form an impurity-doped polycrystalline silicon layer on the buffer layer and an intrinsic polycrystalline silicon layer on the inorganic insulating layer;

forming a first photoresist pattern having a first thickness and a second photoresist pattern having a second thickness greater than the first thickness on the intrinsic polycrystalline silicon layer, wherein the first photoresist pattern is disposed at both sides of the second photoresist pattern, wherein the first and second photoresist patterns correspond to the gate electrode, and the second photoresist pattern corresponds to the active layer;

sequentially etching the intrinsic polycrystalline silicon layer, the inorganic insulating layer and the impurity-doped polycrystalline silicon layer using the first and second photoresist patterns as a first etching mask to form the gate electrode on the buffer layer, the gate insulating layer on the gate electrode and an intrinsic polycrystalline silicon pattern on the inorganic insulating pattern;

removing the first photoresist pattern to expose edge portions of the intrinsic polycrystalline silicon pattern;

etching the intrinsic polycrystalline silicon pattern using the second photoresist pattern as a second etching mask to form the active layer on the gate insulating layer; and removing the second photoresist pattern.

7. The method according to claim 6, wherein the solid phase crystallization method includes a heat treatment of a temperature of about 600° C. to about 700° C. in an alternating magnetic field crystallization (AMFC) apparatus.

8. The method according to claim 1, wherein each of the source barrier pattern and the source ohmic contact layer has the same shape as the source electrode and each of the drain barrier pattern and the drain ohmic contact layer has the same shape as the drain electrode.

9. The method according to claim 1, further comprising:
forming a data pad at an end portion of the data line on the interlayer insulating layer;
forming a gate pad at an end portion of the gate line on the first passivation layer;
forming a gate pad terminal and a data pad terminal on the second passivation layer,
wherein the gate pad terminal is connected to the gate pad through a gate pad contact hole in the second passivation layer, and the data pad terminal is connected to the data pad through a data pad contact hole in the first and second passivation layers.

10. The method according to claim 1, wherein the gate electrode has a thickness of about 500 Å to about 1000 Å, and the active layer has a thickness of about 400 Å to about 600 Å.

11. A method of fabricating an array substrate for a display device, comprising:
forming a buffer layer on a substrate having a pixel region;
sequentially forming a gate electrode of at least one of molybdenum (Mo), molybdenum (Mo) alloy and copper (Cu), a gate insulating layer and an active layer of intrinsic polycrystalline silicon on the buffer layer in the pixel region, edge portions of the gate electrode exposed through the active layer;
forming an interlayer insulating layer of an inorganic insulating material on the active layer, the interlayer insulating layer including active contact holes exposing the active layer;
sequentially forming a source barrier pattern, a source ohmic contact layer and a source electrode on the interlayer insulating layer, sequentially forming a drain barrier pattern, a drain ohmic contact layer and a drain electrode on the interlayer insulating layer, and sequentially forming a first dummy pattern, a second dummy pattern and a data line on the interlayer insulating layer, wherein the source barrier pattern, the drain barrier pattern and the first dummy pattern include intrinsic amorphous silicon, wherein the source ohmic contact layer, the drain ohmic contact layer and the second dummy pattern include impurity-doped amorphous silicon, wherein the source and drain barrier patterns are connected to the active layer through the active contact holes, and wherein the data line is connected to the source electrode;

forming a first passivation layer on a surface of the interlayer insulating layer including the source electrode, the drain electrode and the data line formed thereon, the first passivation layer and the interlayer insulating layer including a gate contact hole exposing the gate electrode;

forming a gate line on the first passivation layer, the gate line connected to the gate electrode through the gate contact hole and crossing the data line to define the pixel region;

forming a second passivation layer on a surface of the first passivation layer including the gate line formed thereon, the second passivation layer and the first passivation layer including a drain contact hole exposing the drain electrode; and forming a pixel electrode on the second passivation layer, the pixel electrode connected to the drain electrode through the drain contact hole.

12. The method according to claim 11, wherein the gate insulating layer has a same area as the active layer.

13. The method according to claim 12, wherein forming the gate electrode, the gate insulating layer and the active layer on the buffer layer comprises:
forming a gate metal layer of the at least one of molybdenum (Mo), molybdenum (Mo) alloy and copper (Cu) on the buffer layer;
sequentially forming an inorganic insulating layer and an intrinsic amorphous silicon layer on the gate metal layer;
crystallizing the intrinsic amorphous silicon layer through a solid phase crystallization method to form an intrinsic polycrystalline silicon layer on the inorganic insulating layer;
forming a first photoresist pattern having a first thickness and a second photoresist pattern having a second thickness greater than the first thickness on the intrinsic polycrystalline silicon layer, wherein the first photoresist pattern is disposed at both sides of the second photoresist pattern, wherein the first and second photoresist patterns correspond to the gate electrode, and the second photoresist pattern corresponds to the active layer;
sequentially etching the intrinsic polycrystalline silicon layer, the inorganic insulating layer and the gate metal layer using the first and second photoresist patterns as a first etching mask to form the gate electrode on the buffer layer, an inorganic insulating pattern on the gate electrode and an intrinsic polycrystalline silicon pattern on the inorganic insulating pattern;
removing the first photoresist pattern to expose edge portions of the intrinsic polycrystalline silicon pattern;
sequentially etching the intrinsic polycrystalline silicon pattern and the inorganic insulating pattern using the second photoresist pattern as a second etching mask to form the gate insulating layer on the gate electrode and the active layer on the gate insulating layer; and
removing the second photoresist pattern.

14. The method according to claim 13, wherein the solid phase crystallization method includes a heat treatment of a temperature of about 600° C. to about 700° C. in an alternating magnetic field crystallization (AMFC) apparatus.

15. The method according to claim 11, wherein the gate insulating layer has a same area as the gate electrode.

16. The method according to claim 15, wherein forming the gate electrode, the gate insulating layer and the active layer on the buffer layer comprises:
- forming a gate metal layer of at least one of molybdenum (Mo), molybdenum (Mo) alloy and copper (Cu) on the buffer layer;
- sequentially forming an inorganic insulating layer and an intrinsic amorphous silicon layer on the gate metal layer;
- crystallizing the intrinsic amorphous silicon layer through a solid phase crystallization method to form an intrinsic polycrystalline silicon layer on the inorganic insulating layer;
- forming a first photoresist pattern having a first thickness and a second photoresist pattern having a second thickness greater than the first thickness on the intrinsic polycrystalline silicon layer, wherein the first photoresist pattern is disposed at both sides of the second photoresist pattern, wherein the first and second photoresist patterns correspond to the gate electrode, and the second photoresist pattern corresponds to the active layer;
- sequentially etching the intrinsic polycrystalline silicon layer, the inorganic insulating layer and the gate metal layer using the first and second photoresist patterns as a first etching mask to form the gate electrode on the buffer layer, the gate insulating layer on the gate electrode and an intrinsic polycrystalline silicon pattern on the inorganic insulating pattern;
- removing the first photoresist pattern to expose edge portions of the intrinsic polycrystalline silicon pattern;
- etching the intrinsic polycrystalline silicon pattern using the second photoresist pattern as a second etching mask to form the active layer on the gate insulating layer; and
- removing the second photoresist pattern.

17. The method according to claim 16, wherein the solid phase crystallization method includes a heat treatment of a temperature of about 600° C. to about 700° C. in an alternating magnetic field crystallization (AMFC) apparatus.

18. The method according to claim 11, wherein the gate electrode has a thickness of about 100 Å to about 1000 Å.

19. The method according to claim 11, wherein each of the source barrier pattern and the source ohmic contact layer has the same shape as the source electrode and each of the drain barrier pattern and the drain ohmic contact layer has the same shape as the drain electrode.

20. The method according to claim 11, further comprising:
- forming a data pad at an end portion of the data line on the interlayer insulating layer;
- forming a gate pad at an end portion of the gate line on the first passivation layer;
- forming a gate pad terminal and a data pad terminal on the second passivation layer, wherein the gate pad terminal is connected to the gate pad through a gate pad contact hole in the second passivation layer, and the data pad terminal is connected to the data pad through a data pad contact hole in the first and second passivation layers.

21. The method according to claim 11, wherein the active layer has a thickness of about 400 Å to about 600 Å.

* * * * *